(12) United States Patent
Park et al.

(10) Patent No.: US 11,410,599 B2
(45) Date of Patent: Aug. 9, 2022

(54) PIXEL OF AN ORGANIC LIGHT EMITTING DIODE DISPLAY DEVICE, AND ORGANIC LIGHT EMITTING DIODE DISPLAY DEVICE

(71) Applicant: Samsung Display Co., Ltd., Yongin-Si (KR)

(72) Inventors: Sehyuk Park, Seongnam-si (KR); Jae Keun Lim, Suwon-si (KR); Hong Soo Kim, Hwaseong-si (KR); Jin Young Roh, Hwaseong-si (KR); Hyo Jin Lee, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/204,213

(22) Filed: Mar. 17, 2021

(65) Prior Publication Data

US 2021/0375201 A1 Dec. 2, 2021

(30) Foreign Application Priority Data

Jun. 2, 2020 (KR) ........................ 10-2020-0066427

(51) Int. Cl.
*G09G 3/3225* (2016.01)
*G09G 3/3233* (2016.01)
*H01L 27/32* (2006.01)

(52) U.S. Cl.
CPC ......... *G09G 3/3225* (2013.01); *G09G 3/3233* (2013.01); *H01L 27/3244* (2013.01);
(Continued)

(58) Field of Classification Search
None
See application file for complete search history.

(56) References Cited

U.S. PATENT DOCUMENTS

| 2011/0157144 A1* | 6/2011 | Park | G09G 3/3233 |
|---|---|---|---|
| | | | 345/212 |
| 2017/0148379 A1* | 5/2017 | Cho | G09G 3/3233 |

(Continued)

FOREIGN PATENT DOCUMENTS

| CN | 110085170 A | 8/2019 |
|---|---|---|
| KR | 101040786 B1 | 6/2011 |

(Continued)

*Primary Examiner* — Dorothy Harris
(74) *Attorney, Agent, or Firm* — Cantor Colburn LLP

(57) ABSTRACT

A pixel of an organic light emitting diode display device includes a capacitor, a first transistor, a second transistor, a third transistor, a fourth transistor, a fifth transistor, a sixth transistor, a seventh transistor, an eighth transistor, a ninth transistor and an organic light emitting diode. The third transistor includes first and second sub-transistors which are coupled to each other in series between a drain of the first transistor and a gate node, and a fourth transistor includes third and fourth sub-transistors which are coupled to each other in series between a line of an initialization voltage and the gate node. The eighth transistor applies a reference voltage to a first node between the first and second sub-transistors in response to an emission signal, and a ninth transistor applies the reference voltage to a second node between the third and fourth sub-transistors in response to the emission signal.

16 Claims, 13 Drawing Sheets

(52) U.S. Cl.
CPC .............. *G09G 2300/0819* (2013.01); *G09G 2300/0842* (2013.01); *G09G 2300/0861* (2013.01); *G09G 2310/08* (2013.01); *G09G 2320/0214* (2013.01); *G09G 2320/0233* (2013.01); *G09G 2320/0247* (2013.01); *G09G 2320/04* (2013.01); *G09G 2320/0626* (2013.01); *G09G 2330/021* (2013.01)

(56) References Cited

U.S. PATENT DOCUMENTS

2018/0151115 A1* 5/2018 Tseng ..................... G09G 3/325
2019/0385523 A1* 12/2019 Na ....................... G09G 3/3291

FOREIGN PATENT DOCUMENTS

| KR | 1020130118459 A | 10/2013 |
| KR | 1020150072593 A | 6/2015 |
| KR | 1020170060219 A | 6/2017 |

* cited by examiner

PIXEL OF AN ORGANIC LIGHT EMITTING DIODE DISPLAY DEVICE, AND ORGANIC LIGHT EMITTING DIODE DISPLAY DEVICE

This application claims priority to Korean Patent Application No. 10-2020-0066427, filed on Jun. 2, 2020, and all the benefits accruing therefrom under 35 U.S.C. § 119, the content of which in its entirety is herein incorporated by reference.

BACKGROUND

1. Field

Embodiments of the invention relate to a display device, and more particularly to a pixel of an organic light emitting diode display device, and the organic light emitting diode display device.

2. Description of the Related Art

Reduction of power consumption may be desirable in an organic light emitting diode ("OLED") display device employed in a portable device, such as a smartphone or a tablet computer. Recently, a low frequency driving technique which decreases a driving frequency when displaying a still image has been developed to reduce the power consumption of the OLED display device.

SUMMARY

In an organic light emitting diode ("OLED") display device, when performing a low frequency driving, the OLED display device may not drive a display panel at one or more frames, and the display panel may display an image based on stored data voltages, to reduce the power consumption. However, while the display panel displays an image based on the stored data voltages, the stored data voltages may be distorted by leakage currents of transistors included in pixels of the display panel, and thus an image quality of the OLED display device may be degraded.

Embodiments of the invention provide a pixel of an OLED display device in which a leakage current of the pixel is substantially reduced or effectively prevented.

Embodiments provide an OLED display device in which a leakage current of each pixel is substantially reduced or effectively prevented.

According to an embodiment, an OLED device includes a capacitor including a first electrode coupled to a line of a first power supply voltage, and a second electrode coupled to a gate node, a first transistor including a gate coupled to the gate node, a second transistor which transfers a data voltage to a source of the first transistor in response to a scan signal, a third transistor which diode-connects the first transistor in response to the scan signal, where the third transistor includes first and second sub-transistors which are coupled in series between a drain of the first transistor and the gate node, a fourth transistor which applies an initialization voltage to the gate node in response to an initialization signal, where the fourth transistor includes third and fourth sub-transistors which are coupled in series between a line of the initialization voltage and the gate node, a fifth transistor which couples the line of the first power supply voltage and the source of the first transistor in response to an emission signal, a sixth transistor which couples the drain of the first transistor and an anode of an organic light emitting diode in response to the emission signal, a seventh transistor which applies the initialization voltage to the anode of the organic light emitting diode in response to the initialization signal, an eighth transistor which applies a reference voltage to a first node between the first and second sub-transistors in response to the emission signal, a ninth transistor which applies the reference voltage to a second node between the third and fourth sub-transistors in response to the emission signal, and the organic light emitting diode including the anode, and a cathode coupled to a line of a second power supply voltage.

In an embodiment, the eighth transistor may apply the reference voltage to the first node in an emission period such that a leakage current between the gate node and the first node in the emission period is reduced, and the ninth transistor may apply the reference voltage to the second node in the emission period such that a leakage current between the gate node and the second node in the emission period is reduced.

In an embodiment, a voltage level of the reference voltage may be determined based on the data voltage and a threshold voltage of the first transistor.

In an embodiment, the first sub-transistor may include a gate which receives the scan signal, a first terminal coupled to the drain of the first transistor, and a second terminal coupled to the first node, the second sub-transistor may include a gate which receives the scan signal, a first terminal coupled to the first node, and a second terminal coupled to the gate node, the third sub-transistor may include a gate which receives the initialization signal, a first terminal coupled to the line of the initialization voltage, and a second terminal coupled to the second node, and the fourth sub-transistor may include a gate which receives the initialization signal, a first terminal coupled to the second node, and a second terminal coupled to the gate node.

In an embodiment, the second transistor may include a gate which receives the scan signal, a first terminal coupled to a data line, and a second terminal coupled to the source of the first transistor, the fifth transistor may include a gate which receives the emission signal, a first terminal coupled to the line of the first power supply voltage, and a second terminal coupled to the source of the first transistor, the sixth transistor may include a gate which receives the emission signal, a first terminal coupled to the drain of the first transistor, and a second terminal coupled to the anode of the organic light emitting diode, and the seventh transistor may include a gate which receives the initialization signal, a first terminal coupled to the line of the initialization voltage, and a second terminal coupled to the anode of the organic light emitting diode.

In an embodiment, the eighth transistor may include a gate which receives the emission signal, a first terminal coupled to a line of the reference voltage, and a second terminal coupled to the first node, and the ninth transistor may include a gate which receives the emission signal, a first terminal coupled to the line of the reference voltage, and a second terminal coupled to the second node.

In an embodiment, a frame period for the pixel may include an initialization period in which the gate node and the anode of the organic light emitting diode are initialized, a data writing period in which a voltage where a threshold voltage of the first transistor is subtracted from the data voltage is stored at the second electrode of the capacitor, and an emission period in which the organic light emitting diode emits light.

In an embodiment, in the initialization period, the fourth and seventh transistors may be turned on, the fourth transistor may apply the initialization voltage to the gate node such that the gate node is initialized, and the seventh transistor may apply the initialization voltage to the anode of the organic light emitting diode such that the anode of the organic light emitting diode is initialized.

In an embodiment, in the data writing period, the second and third transistors may be turned on, the second transistor may transfer the data voltage to the source of the first transistor, and the third transistor may diode-connect the first transistor such that the voltage where the threshold voltage is subtracted from the data voltage is stored at the second electrode of the capacitor.

In an embodiment, in the data writing period, the fifth, sixth, eighth and ninth transistors may be turned on, the first transistor may generate a driving current based on a voltage of the gate node, the fifth and sixth transistors may form a path of the driving current from the line of the first power supply voltage to the line of the second power supply voltage, the eighth transistor may apply the reference voltage to the first node, and the ninth transistor may apply the reference voltage to the second node.

In an embodiment, the first through ninth transistors may be implemented with P-type metal-oxide-semiconductor ("PMOS") transistors.

In an embodiment, the first, second, and fifth through ninth transistors may be implemented with PMOS transistors, and the third and fourth transistors may be implemented with N-type metal-oxide-semiconductor ("NMOS") transistors.

According to an embodiment, a pixel of an OLED device includes a capacitor including a first electrode coupled to a line of a first power supply voltage, and a second electrode coupled to a gate node, a first transistor including a gate coupled to the gate node, a second transistor which transfers a data voltage to a source of the first transistor in response to a scan signal, a third transistor which diode-connects the first transistor in response to the scan signal, where the third transistor includes first and second sub-transistors which are coupled in series between a drain of the first transistor and the gate node, a fourth transistor which applies an initialization voltage to the gate node in response to an initialization signal, where the fourth transistor includes third and fourth sub-transistors which are coupled in series between a line of the initialization voltage and the gate node, a fifth transistor which couples the line of the first power supply voltage and the source of the first transistor in response to an emission signal, a sixth transistor which couples the drain of the first transistor and an anode of an organic light emitting diode in response to the emission signal, a seventh transistor which applies the initialization voltage to the anode of the organic light emitting diode in response to the initialization signal, an eighth transistor which applies a first reference voltage to a first node between the first and second sub-transistors in response to the emission signal, a ninth transistor which applies a second reference voltage to a second node between the third and fourth sub-transistors in response to the emission signal, and the organic light emitting diode including the anode, and a cathode coupled to a line of a second power supply voltage.

In an embodiment, the first reference voltage and the second reference voltage may be a same voltage as each other.

In an embodiment, the first reference voltage and the second reference voltage may be different voltages from each other.

According to an embodiment, an OLED device includes a display panel including a plurality of pixels, a data driver which provides a data voltage to each of the plurality of pixels, a scan driver which provides a scan signal and an initialization signal to each of the plurality of pixels, an emission driver which provides an emission signal to each of the plurality of pixels, a power management circuit which provides a first power supply voltage, a second power supply voltage, an initialization voltage and a reference voltage to the display panel, and a controller which controls the data driver, the scan driver, the emission driver and the power management circuit. Each of the plurality of pixels includes a capacitor including a first electrode coupled to a line of the first power supply voltage, and a second electrode coupled to a gate node, a first transistor including a gate coupled to the gate node, a second transistor which transfers the data voltage to a source of the first transistor in response to the scan signal, a third transistor which diode-connects the first transistor in response to the scan signal, where the third transistor includes first and second sub-transistors which are coupled in series between a drain of the first transistor and the gate node, a fourth transistor which applies the initialization voltage to the gate node in response to the initialization signal, where the fourth transistor includes third and fourth sub-transistors which are coupled in series between a line of the initialization voltage and the gate node, a fifth transistor which couples the line of the first power supply voltage and the source of the first transistor in response to the emission signal, a sixth transistor which couples the drain of the first transistor and an anode of an organic light emitting diode in response to the emission signal, a seventh transistor which applies the initialization voltage to the anode of the organic light emitting diode in response to the initialization signal, an eighth transistor which applies the reference voltage to a first node between the first and second sub-transistors in response to the emission signal, a ninth transistor which applies the reference voltage to a second node between the third and fourth sub-transistors in response to the emission signal, and the organic light emitting diode including the anode, and a cathode coupled to a line of the second power supply voltage.

In an embodiment, the controller may include a reference voltage determination block which determines a voltage level of the reference voltage based on image data for the plurality of pixels and threshold voltages of first transistors of the plurality of pixels.

In an embodiment, the reference voltage determination block may include a threshold voltage storage block which stores a representative threshold voltage of the first transistors of the plurality of pixels, a representative value calculation block which calculates a representative value of the image data for the plurality of pixels, and a control block which determines a representative data voltage corresponding to the representative value of the image data, and determines the voltage level of the reference voltage by subtracting the representative threshold voltage from the representative data voltage.

In an embodiment, the display panel may be divided into a plurality of blocks, and the reference voltage provided to the display panel may include a plurality of block reference voltages provided to the plurality of blocks, respectively.

In an embodiment, the controller may include a reference voltage determination block which determines a voltage level of each of the plurality of block reference voltages based on image data for the plurality of pixels in each of the plurality of blocks and threshold voltages of first transistors of the plurality of pixels in each of the plurality of blocks.

In embodiments of the invention, as described above, in a pixel of an OLED display device and the OLED display device, a third transistor may include first and second sub-transistors which are coupled in series between a drain of a first transistor and a gate node, a fourth transistor may include third and fourth sub-transistors which are coupled in series between a line of an initialization voltage and the gate node, an eighth transistor may apply a reference voltage to a first node between the first and second sub-transistors in response to an emission signal, and a ninth transistor may apply the reference voltage to a second node between the third and fourth sub-transistors in response to the emission signal. Accordingly, a leakage current between the gate node and the first node and a leakage current between the gate node and the second node in an emission period may be substantially reduced, and an image quality of the OLED display device may be improved.

BRIEF DESCRIPTION OF THE DRAWINGS

The above and other features of embodiments of the invention will be more clearly understood from the following detailed description in conjunction with the accompanying drawings.

DETAILED DESCRIPTION

Figure 1:
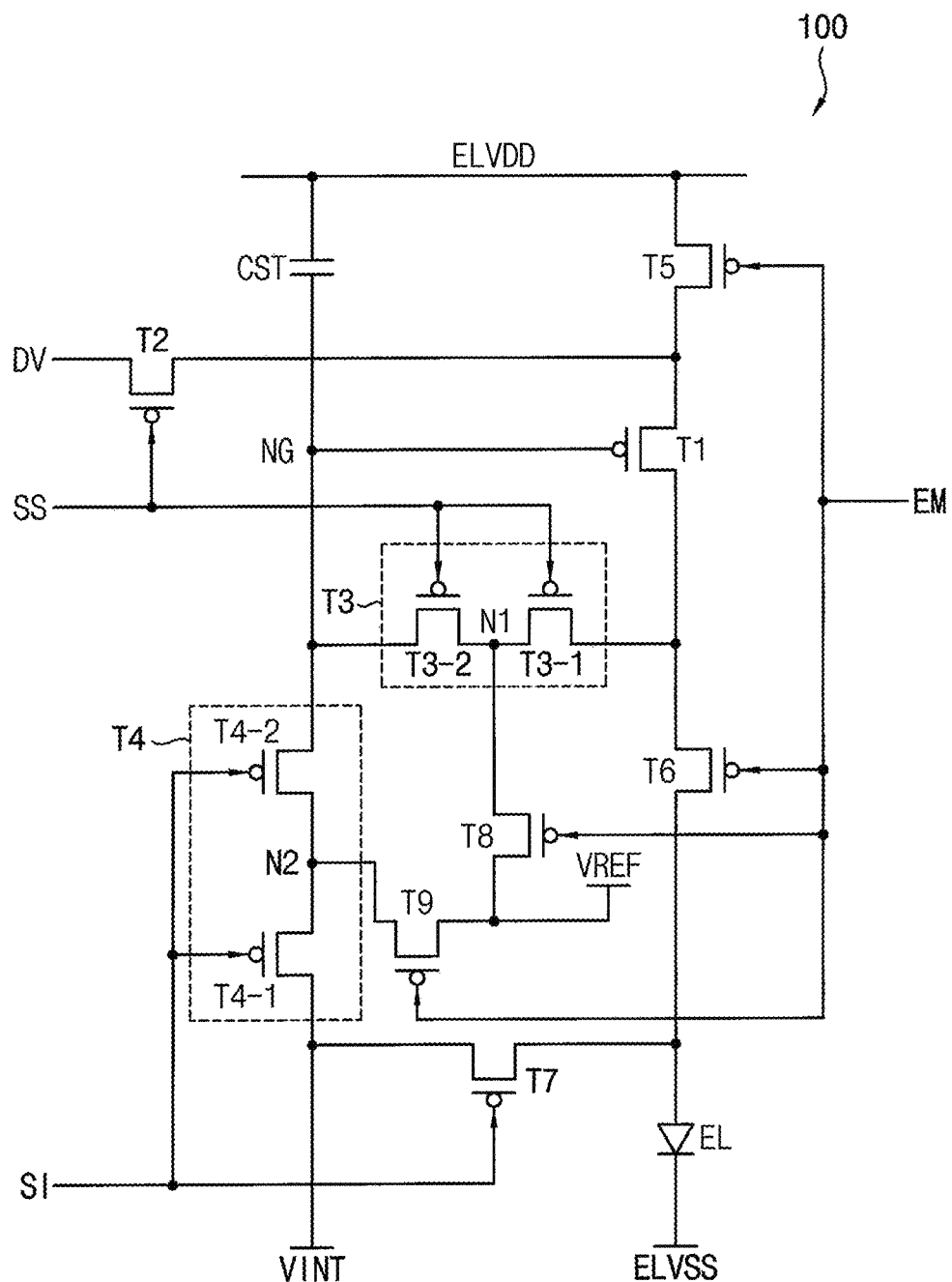
FIG. 1 is a circuit diagram illustrating a pixel of an organic light emitting diode ("OLED") display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can, therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
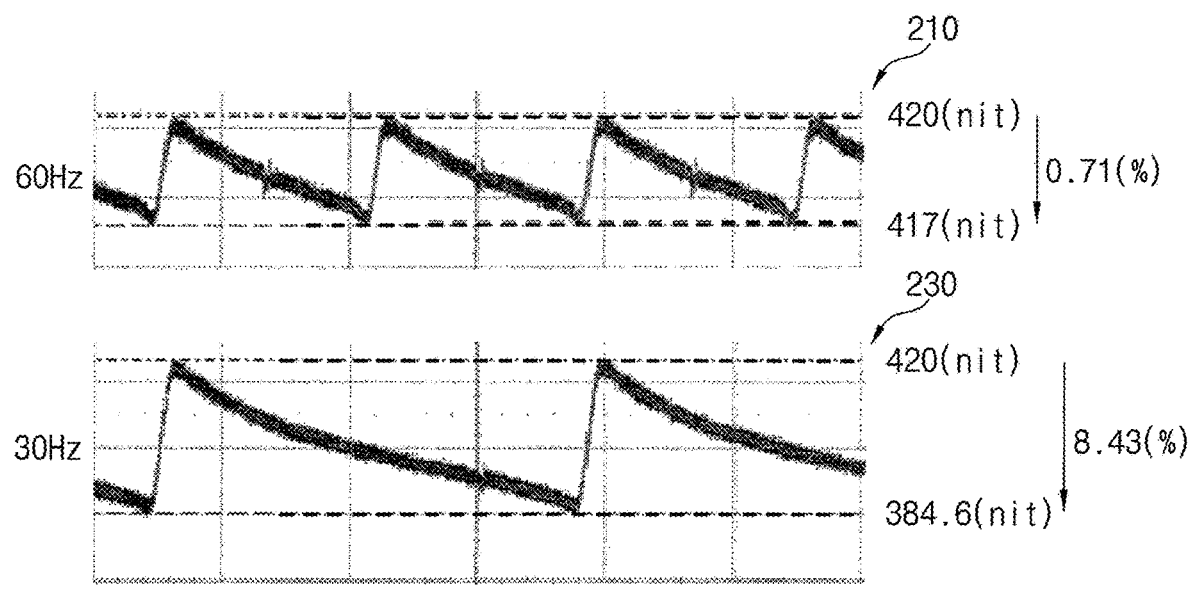
FIG. 2 is a diagram illustrating examples of luminances of a pixel that does not include eighth and ninth transistors according to a driving frequency.

FIG. 1 is a circuit diagram illustrating a pixel of an organic light emitting diode ("OLED") display device according to an embodiment, and FIG. 2 is a diagram illustrating examples of luminances of a pixel that does not include eighth and ninth transistors according to a driving frequency.

Referring to FIG. 1, an embodiment of a pixel 100 of an OLED display device may include a capacitor CST, a first transistor T1, a second transistor T2, a third transistor T3, a fourth transistor T4, a fifth transistor T5, a sixth transistor T6, a seventh transistor T7, an eighth transistor T8, a ninth transistor T9 and an organic light emitting diode EL.

The capacitor CST may store a data voltage DV transferred through the second transistor T2 and the (diode-connected) first transistor T1. The capacitor CST may be referred to as a storage capacitor. In an embodiment, the capacitor CST may include a first electrode coupled (or connected) to a line of a first power supply voltage ELVDD, and a second electrode coupled to a gate node NG.

The first transistor T1 may generate a driving current based on a voltage of the second electrode of the capacitor CST, or a voltage of the gate node NG. The first transistor T1 may be referred to as a driving transistor for driving the organic light emitting diode EL. In an embodiment, the first transistor T1 may include a gate coupled to the second electrode of the capacitor CST, or the gate node NG, a first terminal (or a source) coupled to a second terminal of the fifth transistor T5, and a second terminal (or a drain) coupled to a first terminal of the sixth transistor T6.

The second transistor T2 may transfer the data voltage DV to the source of the first transistor T1 in response to a scan signal SS. The second transistor T2 may be referred to as a switching transistor or a scan transistor for transferring the data voltage DV of a data line. In an embodiment, the second transistor T2 may include a gate which receives the scan signal SS, a first terminal coupled to the data line, and a second terminal coupled to the source of the first transistor T1.

The third transistor T3 may diode-connect the first transistor T1 in response to the scan signal SS. The third transistor T3 may be referred to as a threshold voltage compensating transistor for compensating a threshold voltage of the first transistor T1. While the scan signal SS is applied, the data voltage DV transferred by the second transistor T2 may be stored to the capacitor CST through the first transistor T1 that is diode-connected by the third transistor T3. Accordingly, the capacitor CST may store the data voltage DV where the threshold voltage of the first transistor T1 is compensated.

In an embodiment, as illustrated in FIG. 1, the third transistor T3 may be implemented as a dual transistor including first and second sub-transistors T3-1 and T3-2 that are coupled to each other in series between the drain of the first transistor T1 and the gate node NG. In such an embodiment, a leakage current of the third transistor T3 from the gate node NG or to the gate node NG may be substantially reduced. In an embodiment, the first sub-transistor T3-1 may include a gate which receives the scan signal SS, a first terminal coupled to the drain of the first transistor T1, and a second terminal coupled to a first node N1 between the first and second sub-transistors T3-1 and T3-2, and the second sub-transistor T3-2 may include a gate which receives the scan signal SS, a first terminal coupled to the first node N1, and a second terminal coupled to the gate node NG.

The fourth transistor T4 may apply an initialization voltage VINT to the gate node NG in response to an initialization signal SI. The fourth transistor T4 may be referred to as a gate initializing transistor for initializing the gate node NG. While the initialization signal SI is applied, the fourth transistor T4 may apply the initialization voltage VINT to the gate node NG, and the gate of the first transistor T1 and the capacitor CST may be initialized based on the initialization voltage VINT of the gate node NG.

In an embodiment, as illustrated in FIG. 1, the fourth transistor T4 may be implemented as a dual transistor including third and fourth sub-transistors T4-1 and T4-2 that are coupled to each other in series between a line of the initialization voltage VINT and the gate node NG. In this case, a leakage current of the fourth transistor T4 from the gate node NG or to the gate node NG may be substantially reduced. Further, in an embodiment, the third sub-transistor T4-1 may include a gate which receives the initialization signal SI, a first terminal coupled to the line of the initialization voltage VINT, and a second terminal coupled to a second node N2 between the third and fourth sub-transistors T4-1 and T4-2, and the fourth sub-transistor T4-2 may include a gate which receives the initialization signal SI, a first terminal coupled to the second node N2, and a second terminal coupled to the gate node NG.

The fifth transistor T5 may couple (or connect) the line of the first power supply voltage ELVDD to the source of the first transistor T1 in response to an emission signal EM, and the sixth transistor T6 may couple the drain of the first transistor T1 to an anode of the organic light emitting diode EL in response to the emission signal EM. The fifth and sixth transistors T5 and T6 may be referred to as emission transistors for allowing the organic light emitting diode EL to emit light. While the emission signal EM is applied, the fifth and sixth transistors T5 and T6 may be turned on to form a path of the driving current from the line of the first power supply voltage ELVDD to a line of a second power supply voltage ELVSS. In an embodiment, the fifth transistor T5 may include a gate which receives the emission signal EM, a first terminal coupled to the line of the first power supply voltage ELVDD, and a second terminal coupled to the source of the first transistor T1, and the sixth transistor T6 may include a gate which receives the emission signal EM, a first terminal coupled to the drain of the first transistor T1, and a second terminal coupled to the anode of the organic light emitting diode EL.

The seventh transistor T7 may apply the initialization voltage VINT to the anode of the organic light emitting diode EL in response to the initialization signal SI. The seventh transistor T7 may be referred to as a diode initializing transistor for initializing the organic light emitting diode EL. While the initialization signal SI is applied, the seventh transistor T7 may initialize the organic light emitting diode EL by using the initialization voltage VINT. In an embodiment, the seventh transistor T7 may include a gate which receives the initialization signal SI, a first terminal coupled to the line of the initialization voltage VINT, and a second terminal coupled to the anode of the organic light emitting diode EL.

The eighth transistor T8 may apply a reference voltage VREF to the first node N1 between the first and second sub-transistors T3-1 and T3-2 in response to the emission signal EM, and the ninth transistor T9 may apply the reference voltage VREF to the second node N2 between the third and fourth sub-transistors T4-1 and T4-2 in response to the emission signal EM. The eighth and ninth transistors T8 and T9 may be referred to as node controlling transistors for controlling the first node N1 and the second node N2. While the emission signal EM is applied, the eighth and ninth transistors T8 and T9 may apply the reference voltage VREF to the first and second nodes N1 and N2, and the leakage current between the gate node NG and the first node N1 and the leakage current between the gate node NG and the second node N2 may be substantially reduced based on the reference voltage VREF applied to the first and second nodes N1 and N2. In an embodiment, the eighth transistor T8 may include a gate which receives the emission signal EM, a first terminal coupled to a line of the reference voltage VREF, and a second terminal coupled to the first node N1, and the ninth transistor T9 may include a gate which receives the emission signal EM, a first terminal coupled to the line of the reference voltage VREF, and a second terminal coupled to the second node N2.

In an embodiment, as illustrated in FIG. 1, the first through ninth transistors T1 through T9 may be implemented with P-type metal-oxide-semiconductor ("PMOS") transistors. In one embodiment, for example, the first through ninth transistors T1 through T9 may be implemented with low-temperature polycrystalline silicon ("LTPS") PMOS transistors.

The organic light emitting diode EL may emit light based on the driving current generated by the first transistor T1. While the emission signal EM is applied, the driving current generated by the first transistor T1 may be provided to the organic light emitting diode EL, and the organic light emitting diode EL may emit light based on the driving current. In an embodiment, the organic light emitting diode EL may include the anode coupled to the second terminal of the sixth transistor T6, and a cathode coupled to the line of the second power supply voltage ELVSS.

In an embodiment, the OLED display device including the pixel 100 may perform low frequency driving, for example, when a still image is displayed, to reduce power consumption. In such an embodiment, when the low frequency driving is performed, in at least a portion of a plurality of frame periods, or in a low frequency hold period, each pixel 100 may not receive the initialization signal SI, the scan signal SS and the data voltage DV, and may emit light based on the data voltage DV that is stored in the capacitor CST in a previous frame period. In such an embodiment, the data voltage DV stored in the capacitor CST, or the voltage of the gate node NG may be distorted due to a leakage current of the transistors T1 through T7 of the pixel 100, e.g., a leakage current of the third and fourth transistors T3 and T4 directly coupled to the second electrode of the capacitor CST, or the gate node NG, and thus an image quality of the OLED display device may be degraded. In an embodiment of the pixel 100, as described above, the third transistor T3 may be implemented as the dual transistor including the first and second sub-transistors T3-1 and T3-2, and the fourth transistor T4 may be implemented as the dual transistor including the third and fourth sub-transistors T4-1 and T4-2, to reduce the leakage current of the third and fourth transistors T3 and T4. Accordingly, the leakage current of the third and fourth transistors T3 and T4 from the gate node NG or to the gate node NG may be substantially reduced.

In such an embodiment, where the third transistor T3 includes the first and second sub-transistors T3-1 and T3-2, a parasitic capacitor may be formed between the first node N1 between the first and second sub-transistors T3-1 and T3-2 and a line (e.g., a line of the scan signal SS) of the pixel 100, and thus a leakage current of the second sub-transistor T3-2 from the first node N1 to the gate node NG may occur. In such an embodiment, where the fourth transistor T4 includes the third and fourth sub-transistors T4-1 and T4-2, a parasitic capacitor may be formed between the second node N2 between the third and fourth sub-transistors T4-1 and T4-2 and a line (e.g., a line of the initialization signal SI) of the pixel 100, and thus a leakage current of the fourth sub-transistor T4-2 from the second node N2 to the gate node NG may occur. Accordingly, by the leakage currents of the second and fourth sub-transistors T3-2 and T4-2, the voltage of the gate node NG may be increased, the driving current of the first transistor T1 may be decreased, and thus luminance of the organic light emitting diode EL may be decreased. Thus, in a conventional pixel that does not include the eighth and ninth transistors T8 and T9, the voltage of the gate node NG may be increased by the leakage currents to the gate node NG, and the luminance of the organic light emitting diode EL may be decreased. In particular, as a driving frequency of a conventional OLED display device including the conventional pixel is increased, the luminance of the conventional OLED display device may be further decreased, and a flicker caused by a luminance difference may be perceived in the conventional OLED display device operating a low driving frequency. When the conventional OLED display device operates at a driving frequency of about 60 Hz, as illustrated as 210 of FIG. 2, for example, the luminance of the conventional pixel may be decreased by about 0.71% from luminance of about 420 nit to luminance of about 417 nit in each frame period. Further, in a case where the driving current is decreased, or in a case where the conventional OLED display device operates at a driving frequency of about 30 Hz, as illustrated as 230 of FIG. 2, the luminance of the conventional pixel may be decreased by about 8.43% from luminance of about 420 nit to luminance of about 384.6 nit in each frame period, and a flicker caused by a luminance difference between about 384.6 nit and about 420 may be perceived.

In an embodiment of the pixel 100 of the OLED display device according to the invention, the eighth transistor T8 may apply the reference voltage VREF to the first node N1 in an emission period to reduce a leakage current between the gate node NG and the first node N1 in the emission period, and the ninth transistor T9 may apply the reference voltage VREF to the second node N2 in the emission period to reduce a leakage current between the gate node NG and the second node N2 in the emission period. In such an embodiment, a voltage level of the reference voltage VREF may be determined based on the data voltage DV and the threshold voltage of the first transistor T1 such that the reference voltage VREF may have the voltage level close to the voltage of the gate node NG. In one embodiment, for example, the reference voltage VREF may be determined as a voltage where the threshold voltage of the first transistor T1 is subtracted from the data voltage DV. In an embodiment, the reference voltage VREF may be determined as a voltage where an average of the threshold voltages of the first transistors T1 of all pixels 100 of the OLED display device is subtracted from an average of the data voltages DV for the all pixels 100. In an alternative embodiment, the pixels 100 of the OLED display device may be grouped into a plurality of blocks, and the reference voltage VREF for each block may be determined as a voltage where an average of the threshold voltages of the first transistors T1 of the pixels 100 in the block is subtracted from an average of the data voltages DV for the pixels 100 in the block. In another alternative embodiment, the reference voltage VREF for each pixel 100 may be determined as a voltage where the threshold voltage of the first transistor T1 of the pixel 100 is subtracted from the data voltage DV for the pixel 100. Accordingly, in such embodiments, all of a voltage of the first node N1, a voltage of the second node N2 and the voltage of the gate node NG may become substantially the same voltage as each other, or the voltage where the threshold voltage is subtracted from the data voltage DV, and thus the leakage current between the gate node NG and the first node N1 and the leakage current between the gate node NG and the second node N2 may be effectively prevented or substantially reduced.

As described above, in an embodiment of the pixel 100 according to the invention, the third transistor T3 may include the first and second sub-transistors T3-1 and T3-2 that are coupled to each other in series between the drain of the first transistor T1 and the gate node NG, the fourth transistor T4 may include the third and fourth sub-transistors T4-1 and T4-2 that are coupled to each other in series between the line of the initialization voltage VINT and the gate node NG, the eighth transistor T8 may apply the reference voltage VREF to the first node N1 between the first and second sub-transistors T3-1 and T3-2 in response to the emission signal EM, and the ninth transistor T9 may apply the reference voltage VREF to the second node N2 between the third and fourth sub-transistors T4-1 and T4-2 in response to the emission signal EM. Accordingly, the leakage current between the gate node NG and the first node N1 and the leakage current between the gate node NG and the second node N2 may be substantially reduced, and an image quality of the OLED display device including the pixel 100 may be improved.

Figure 3:
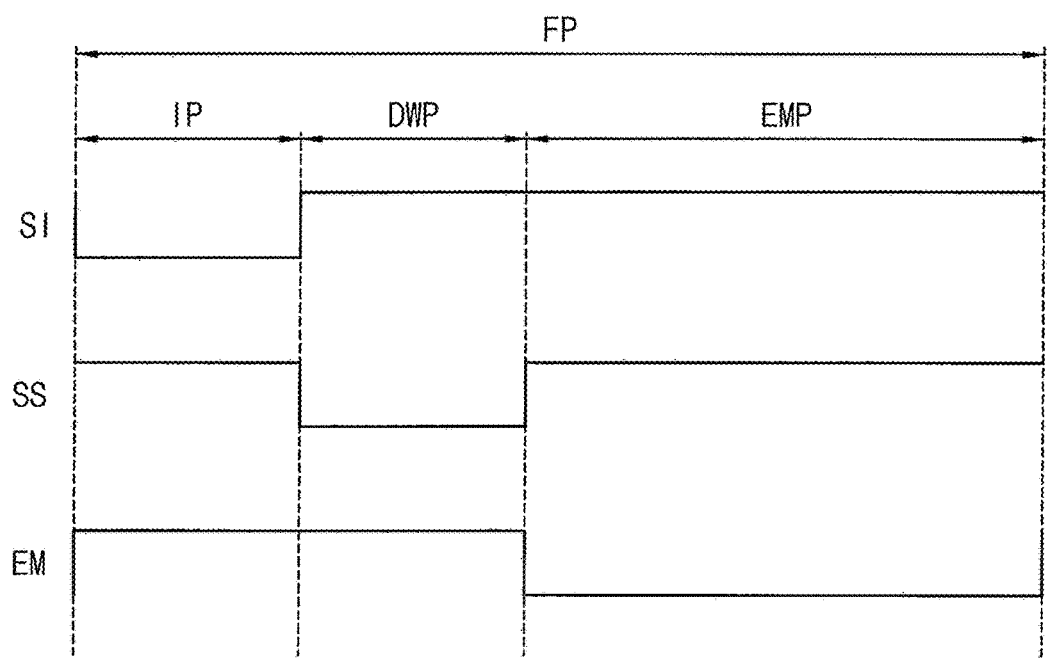
FIG. 3 is a timing diagram for describing an operation of a pixel according to an embodiment.
Figure 4:
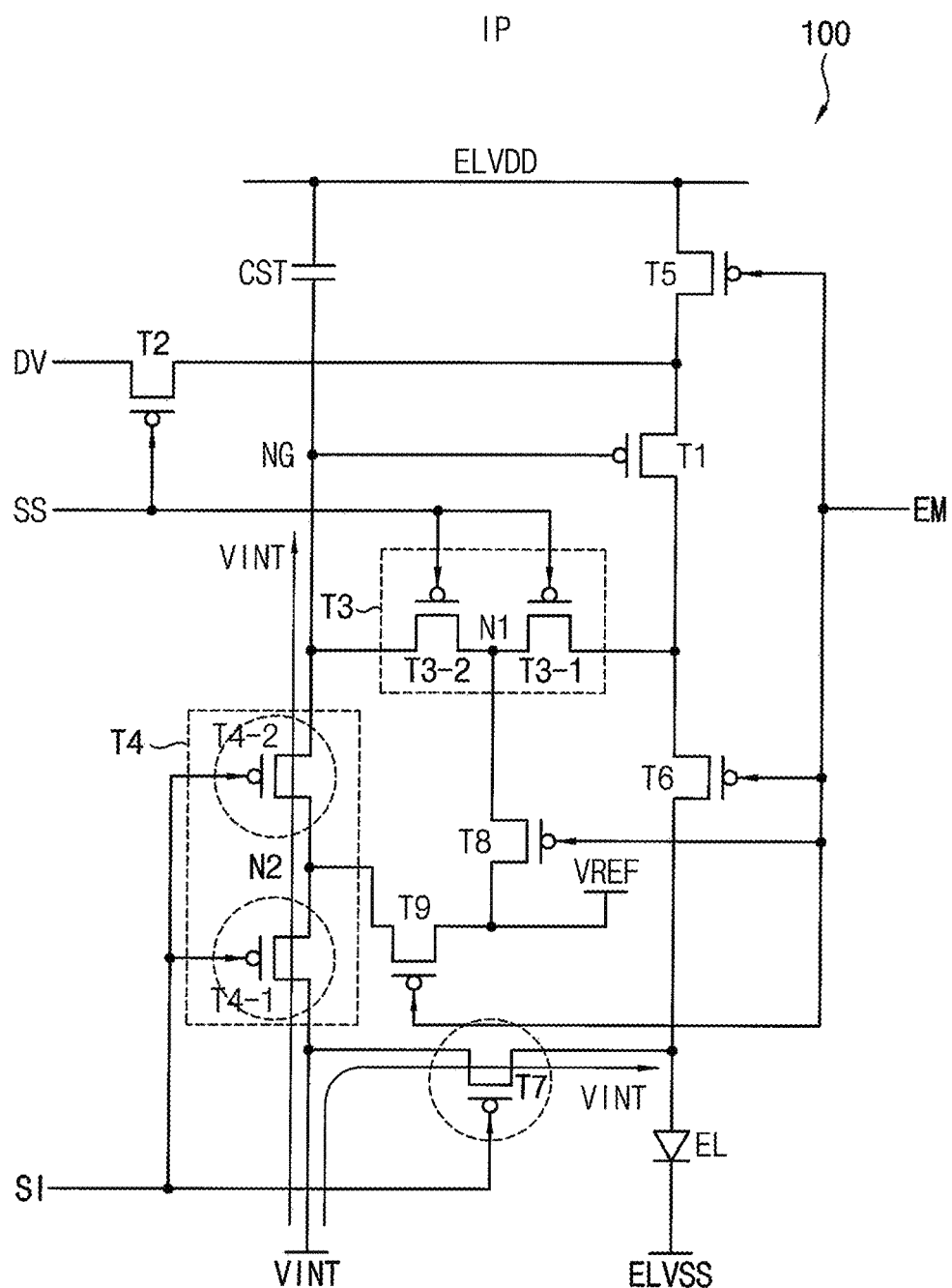
FIG. 4 is a circuit diagram for describing an embodiment of an operation of a pixel in an initialization period.
Figure 5:
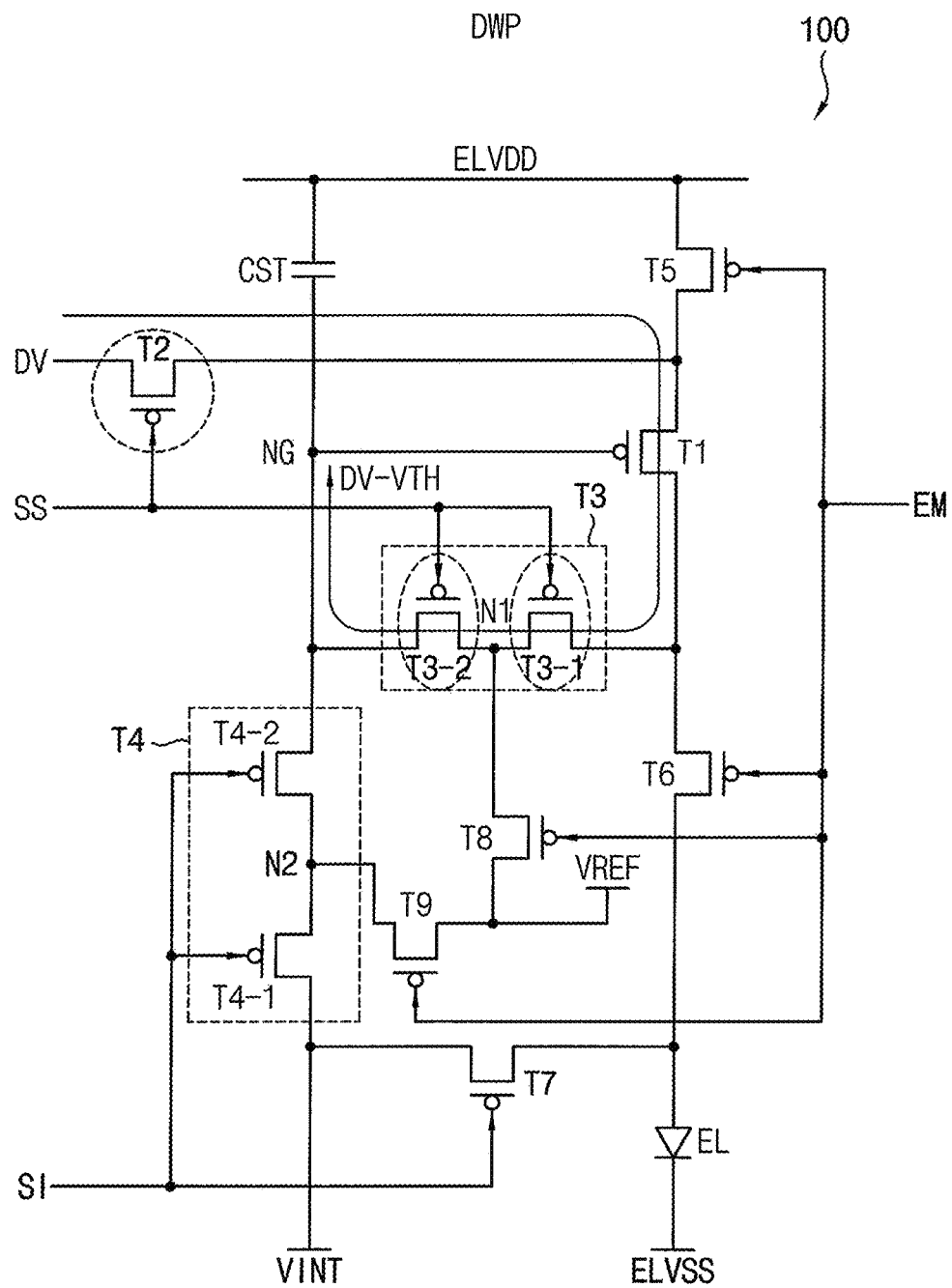
FIG. 5 is a circuit diagram for describing an embodiment of an operation of a pixel in a data writing period.
Figure 6:
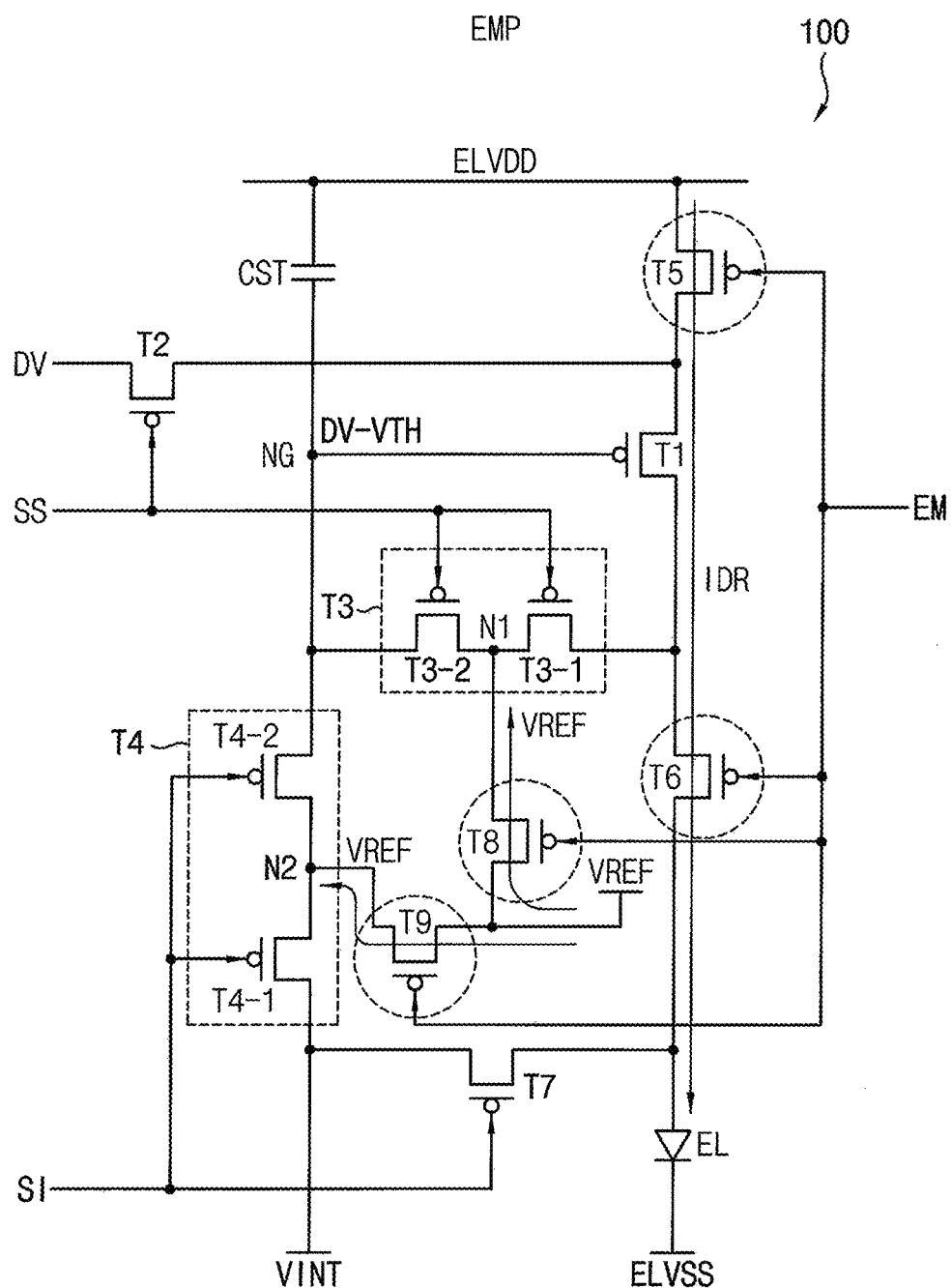
FIG. 6 is a circuit diagram for describing an embodiment of an operation of a pixel in an emission period.

FIG. 3 is a timing diagram for describing an operation of a pixel according to an embodiment, FIG. 4 is a circuit diagram for describing an embodiment of an operation of a pixel in an initialization period, FIG. 5 is a circuit diagram for describing an embodiment of an operation of a pixel in a data writing period, and FIG. 6 is a circuit diagram for describing an embodiment of an operation of a pixel in an emission period.

Referring to FIGS. 1 and 3, a frame period FP for a pixel 100 may include an initialization period IP, a data writing period DWP and an emission period EMP. In an embodiment, first through ninth transistors T1 through T9 of the pixel 100 may be implemented with PMOS transistors, and an initialization signal SI, a scan signal SS and an emission signal EM may be active low signals that have a low level as an on level and a high level as an off level.

In the initialization period IP, a gate node NG and an anode of an organic light emitting diode EL may be initialized. In the initialization period IP, as shown in FIG. 3, the emission signal EM and the scan signal SS may have the off level, and the initialization signal SI may have the on level. In such an embodiment, as illustrated in FIG. 4, in the initialization period IP, the fourth and seventh transistors T4 and T7 may be turned on in response to the initialization signal SI having the on level. Thus, the fourth transistor T4 may apply the initialization voltage VINT to the gate node, and thus the gate node NG, or a gate of the first transistor T1 and the capacitor CST may be initialized. In the initialization period IP, the seventh transistor T7 may apply the initialization voltage VINT to the anode of the organic light emitting diode EL, and thus the anode of the organic light emitting diode EL may be initialized.

In the data writing period DWP, a voltage obtained by subtracting a threshold voltage of the first transistor T1 from a data voltage DV is stored at a second electrode of the capacitor CST. In the data writing period DWP, as shown in FIG. 3, the emission signal EM and the initialization signal SI may have the off level, and the scan signal SS may have the on level. In the data writing period DWP, as illustrated in FIG. 5, the second and third transistors T2 and T3 may be turned on in response to the scan signal SS having the on level. Thus, the second transistor T2 may transfer the data voltage DV of a data line to a source of the first transistor T1. In the data writing period DWP, the third transistor T3 may diode-connect the first transistor T1, and thus the voltage DV-VTH obtained by subtracting the threshold voltage VTH from the data voltage DV may be stored at the second electrode of the capacitor CST through the diode-connected first transistor T1.

In the emission period EMP, the organic light emitting diode EL may emit light. In the emission period EMP, as shown in FIG. 3, the initialization signal SI and the scan signal SS may have the off level, and the emission signal EM may have the on level. In the emission period EMP, as illustrated in FIG. 6, the fifth, sixth, eighth and ninth transistors T5, T6, T8 and T9 may be turned on in response to the emission signal EM having the on level. The first transistor T1 may generate a driving current IDR based on a voltage DV-VTH of the gate node NG, or a voltage DV-VTH of the second electrode of the capacitor CST, the fifth and sixth transistors T5 and T6 may form a path of the driving current IDR from a line of a first power supply voltage ELVDD to a line of a second power supply voltage ELVSS, and the organic light emitting diode EL may emit light based on the driving current IDR generated by the first transistor T1. Thus, since the driving current IDR is generated based on the voltage DV-VTH obtained by subtracting the threshold voltage from the data voltage DV, the driving current IDR may be determined based on the data voltage DV regardless of the threshold voltage VTH of the first transistor T1.

In the emission period EMP, as illustrated in FIG. 6, the eighth transistor T8 may apply a reference voltage VREF to a first node N1 between first and second sub-transistors T3-1 and T3-2, and the ninth transistor T9 may apply the reference voltage VREF to a second node N2 between third and fourth sub-transistors T4-1 and T4-2. In the emission period EMP, the reference voltage VREF may have a voltage level close to the voltage DV-VTH of the gate node NG, and thus a leakage current between the gate node NG and the first node N1 and a leakage current between the gate node NG and the second node N2 may be substantially reduced.

Figure 7:
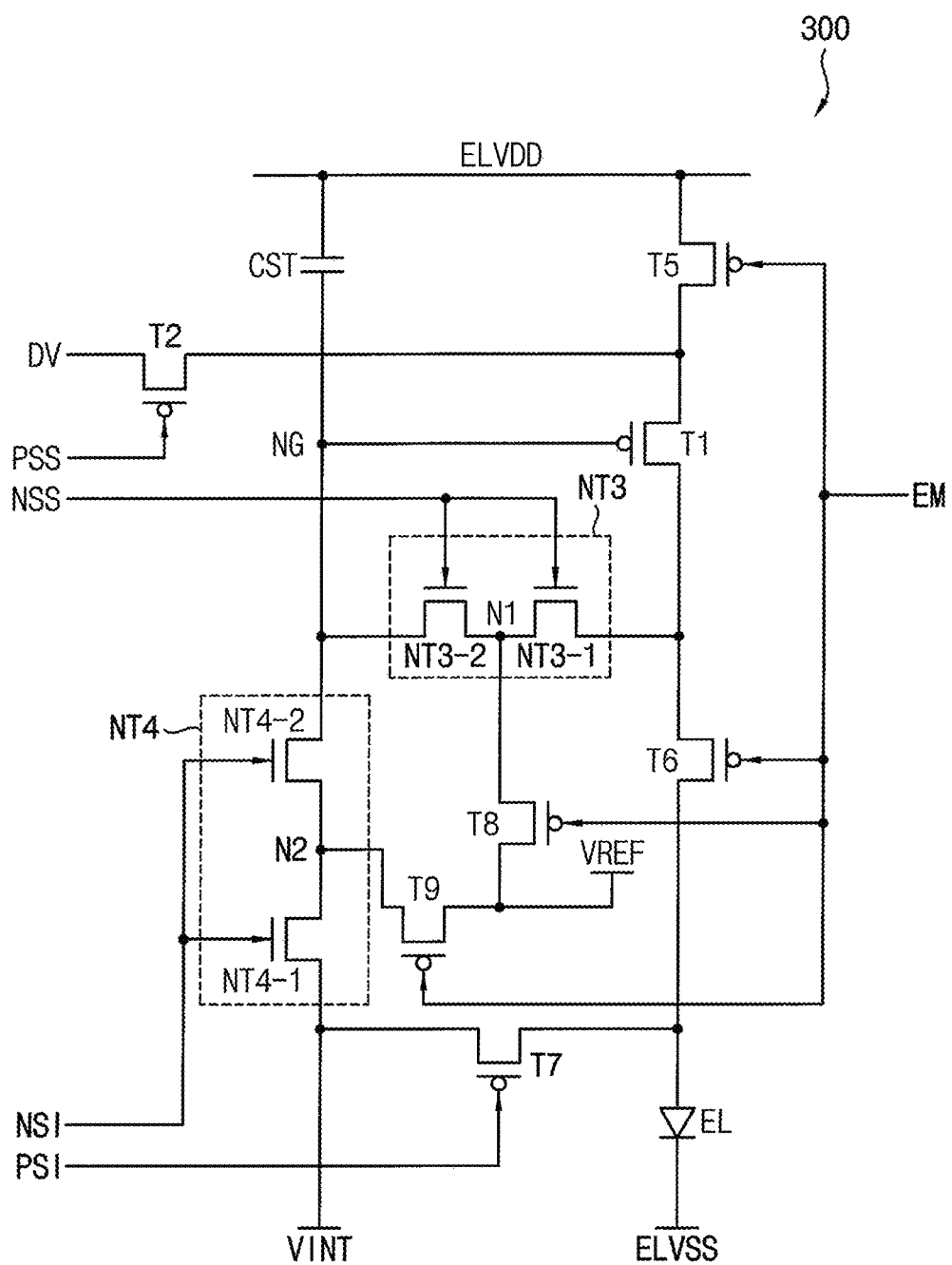
FIG. 7 is a circuit diagram illustrating a pixel of an OLED display device according to an alternative embodiment.
Figure 8:
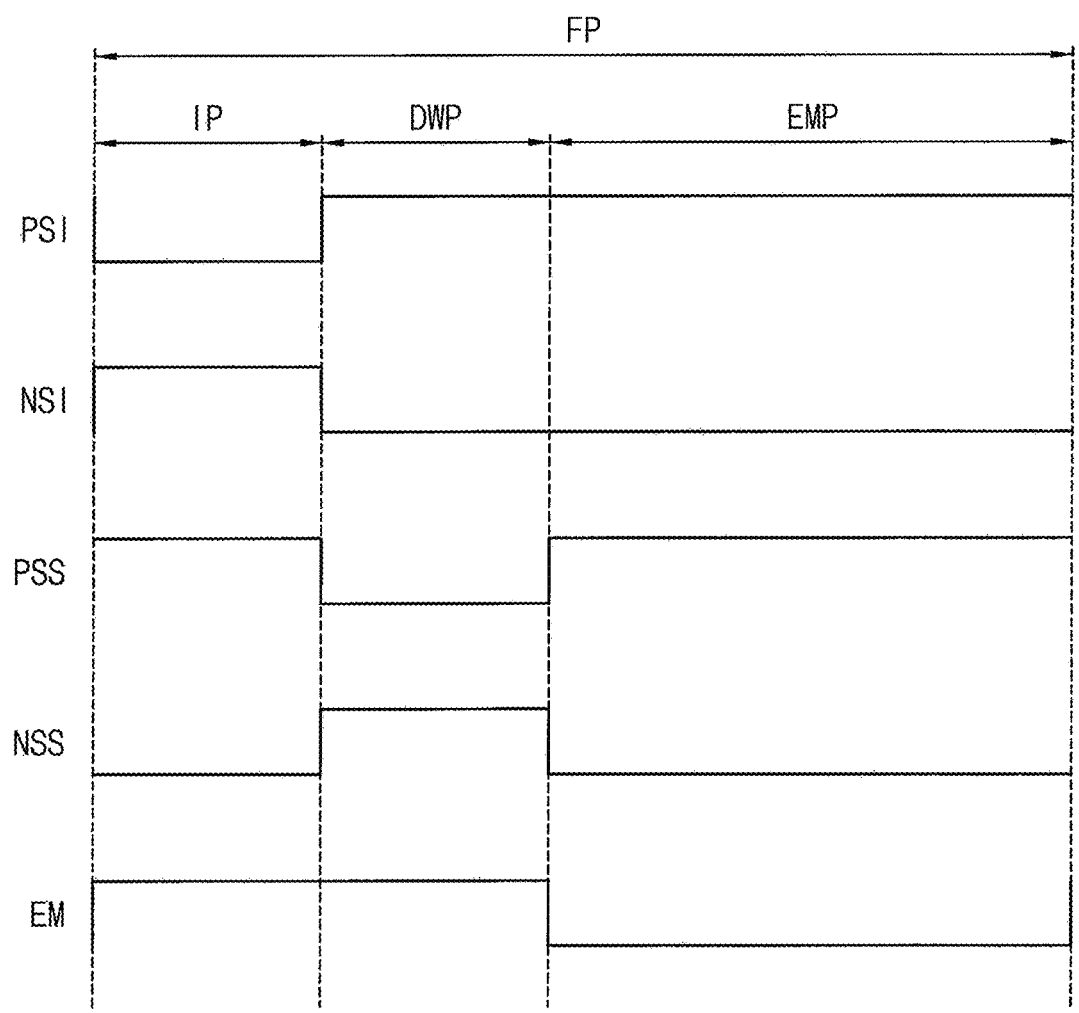
FIG. 8 is a timing diagram for describing an operation of a pixel according to an alternative embodiment.

FIG. 7 is a circuit diagram illustrating a pixel of an OLED display device according to an alternative embodiment, and FIG. 8 is a timing diagram for describing an operation of a pixel according to an alternative embodiment.

Referring to FIG. 7, an embodiment of a pixel 300 of an OLED display device may include a capacitor CST, a first transistor T1, a second transistor T2, a third transistor NT3, a fourth transistor NT4, a fifth transistor T5, a sixth transistor T6, a seventh transistor T7, an eighth transistor T8, a ninth transistor T9 and an organic light emitting diode EL. The pixel 300 of FIG. 7 may have substantially the same configuration as a pixel 100 of FIG. 1, except that the third and fourth transistors NT3 and NT4 may be implemented with N-type metal-oxide-semiconductor ("NMOS") transistors. In such an embodiment, signals PSS, NSS, PSI, NSI and EM provided to the pixel 300 illustrated in FIGS. 7 and 8 may be substantially the same as signals SS, SI and EM provided to the pixel 100 illustrated in FIGS. 1 and 3, except that signals NSS and NSI applied to the third and fourth transistors NT3 and NT4 may be active high signals.

In another alternative embodiment of the pixel 300, the first, second, and fifth through ninth transistors T1, T2, T5, T6, T7, T8 and T9 may be implemented with PMOS transistors, and the third and fourth transistors NT3 and NT4 may be implemented with NMOS transistors. In one embodiment, for example, the first, second, and fifth through ninth transistors T1, T2, T5, T6, T7, T8 and T9 may be implemented with LTPS PMOS transistors, and first, second, third and fourth sub-transistors NT3-1, NT3-2, NT4-1 and NT4-2 of the third and fourth transistors NT3 and NT4 may be implemented with oxide NMOS transistors. In such an embodiment, the third and fourth transistors NT3 and NT4, or the first, second, third and fourth sub-transistors NT3-1, NT3-2, NT4-1 and NT4-2 directly coupled to the capacitor CST may be implemented with the NMOS transistors having relatively small leakage currents, and thus leakage currents of the third and fourth transistors NT3 and NT4 from a gate node NG or to the gate node NG may be further reduced.

In an embodiment, as illustrated in FIGS. 7 and 8, an initialization signal PSI, a scan signal PSS and an emission signal EM applied to the second, and fifth through ninth transistors T2, T5, T6, T7, T8 and T9 may be active low signals that have a low level as an on level and a high level as an off level, and an initialization signal NSI and a scan signal NSS applied to the third and fourth transistors NT3 and NT4 may be active high signals that have a high level as the on level and a low level as the off level.

Figure 9:
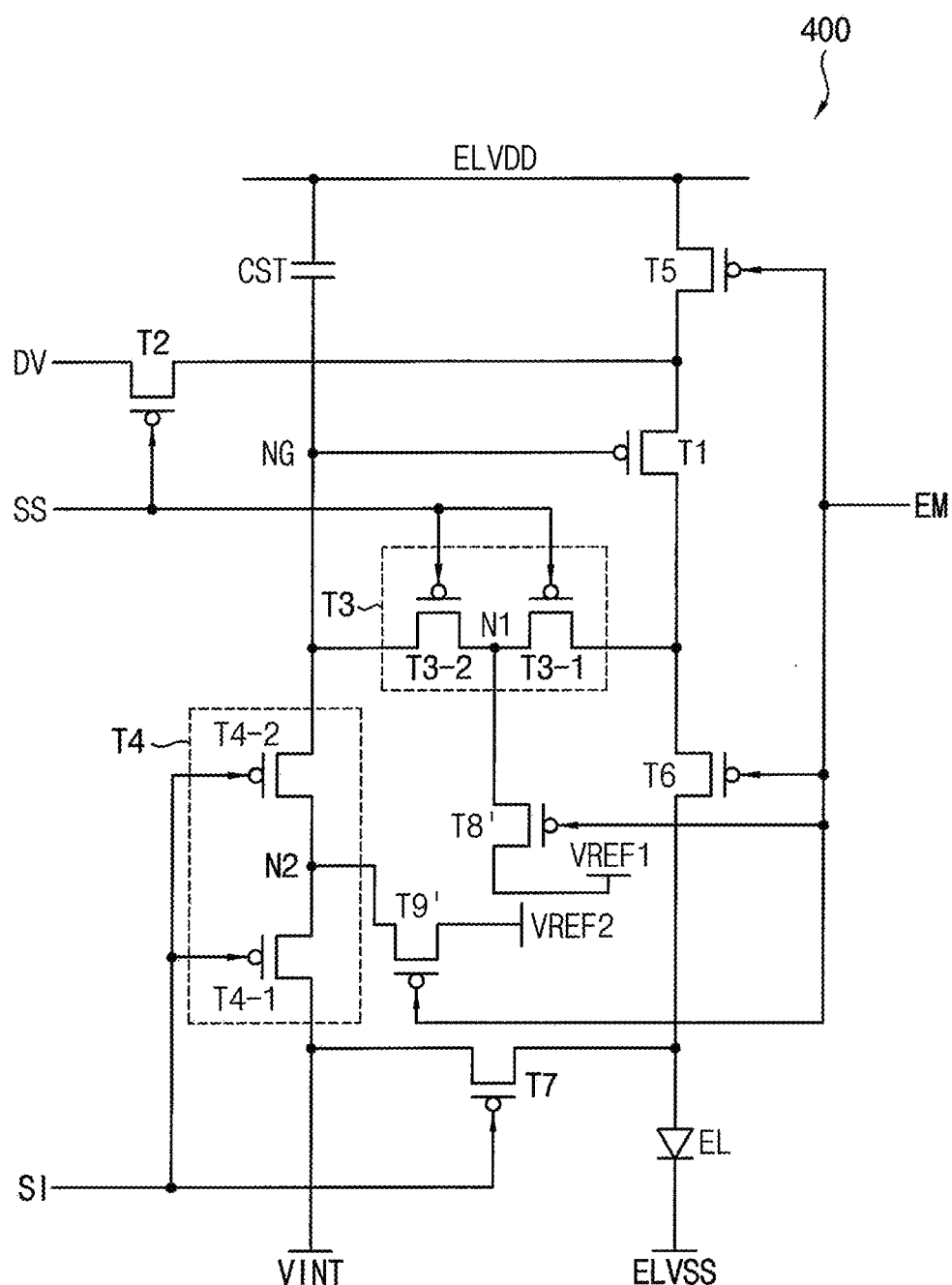
FIG. 9 is a circuit diagram illustrating a pixel of an OLED display device according to another alternative embodiment.

FIG. 9 is a circuit diagram illustrating a pixel of an OLED display device according to another alternative embodiment.

Referring to FIG. 9, an embodiment of a pixel 400 of an OLED display device may include a capacitor CST, a first transistor T1, a second transistor T2, a third transistor T3, a fourth transistor T4, a fifth transistor T5, a sixth transistor T6, a seventh transistor T7, an eighth transistor T8', a ninth transistor T9' and an organic light emitting diode EL. The pixel 400 of FIG. 9 may have substantially the same configuration as a pixel 100 of FIG. 1, except that the eighth transistor T8' may be coupled to a line of a first reference voltage VREF1, and the ninth transistor T9' may be coupled to a line of a second reference voltage VREF2.

The eighth transistor T8' may apply the first reference voltage VREF1 to a first node N1 between first and second sub-transistors T3-1 and T3-2 of the third transistor T3, and the ninth transistor T9' may apply the second reference voltage VREF2 to a second node N2 between third and fourth sub-transistors T4-1 and T4-2 of the fourth transistor T4. In an embodiment, the first reference voltage VREF1 and the second reference voltage VREF2 may be substantially a same voltage as each other. In an alternative embodiment, the first reference voltage VREF1 and the second reference voltage VREF2 may be different voltages from each other. In such an embodiment, the first reference voltage VREF1 may have a voltage level suitable for the first node N1, the second reference voltage VREF2 may have a voltage level suitable for the second node N2, and thus a leakage current between a gate node NG and the first node N1 and a leakage current between the gate node NG and the second node N2 may be further reduced.

Figure 10:
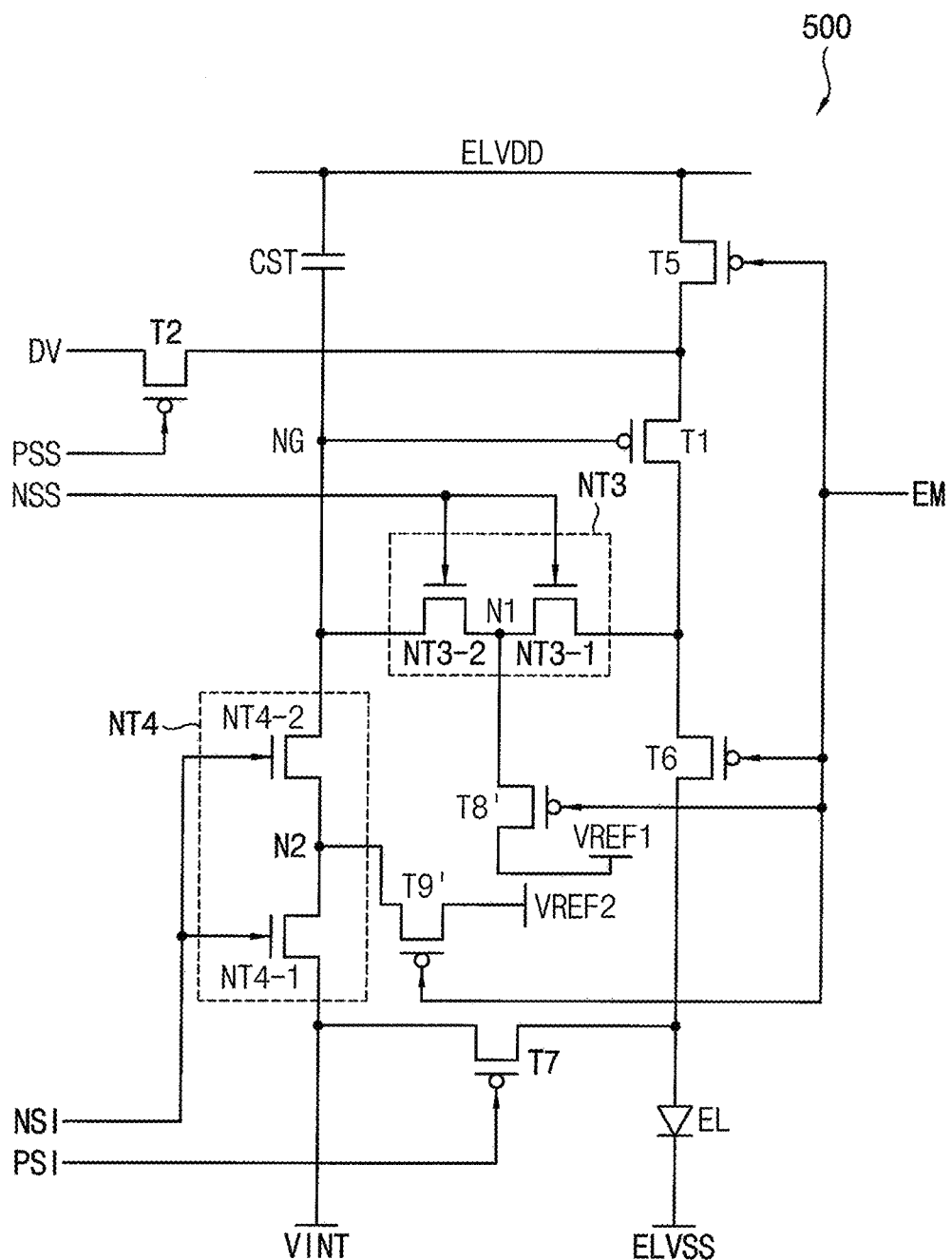
FIG. 10 is a timing diagram for describing an operation of a pixel according to another alternative embodiment.

FIG. 10 is a timing diagram for describing an operation of a pixel according to another alternative embodiment.

Referring to FIG. 10, an embodiment of a pixel 500 of an OLED display device may include a capacitor CST, a first transistor T1, a second transistor T2, a third transistor NT3, a fourth transistor NT4, a fifth transistor T5, a sixth transistor T6, a seventh transistor T7, an eighth transistor T8', a ninth transistor T9' and an organic light emitting diode EL. The pixel 500 of FIG. 10 may have substantially the same configuration as a pixel 400 of FIG. 9, except that the third and fourth transistors NT3 and NT4 may be implemented with NMOS transistors. In such an embodiment, signals PSS, NSS, PSI, NSI and EM provided to the pixel 500 illustrated in FIG. 10 may be substantially the same as signals SS, SI and EM provided to the pixel 400 illustrated in FIG. 9, except that signals NSS and NSI applied to the third and fourth transistors NT3 and NT4 may be active high signals.

In an embodiment of the pixel 500, the first, second, and fifth through ninth transistors T1, T2, T5, T6, T7, T8' and T9' may be implemented with PMOS transistors, and the third and fourth transistors NT3 and NT4 may be implemented with NMOS transistors. In such an embodiment, the third and fourth transistors NT3 and NT4, or first, second, third and fourth sub-transistors NT3-1, NT3-2, NT4-1 and NT4-2 directly coupled to the capacitor CST may be implemented with the NMOS transistors having relatively small leakage currents, and thus leakage currents of the third and fourth transistors NT3 and NT4 from a gate node NG or to the gate node NG may be further reduced.

Figure 11:
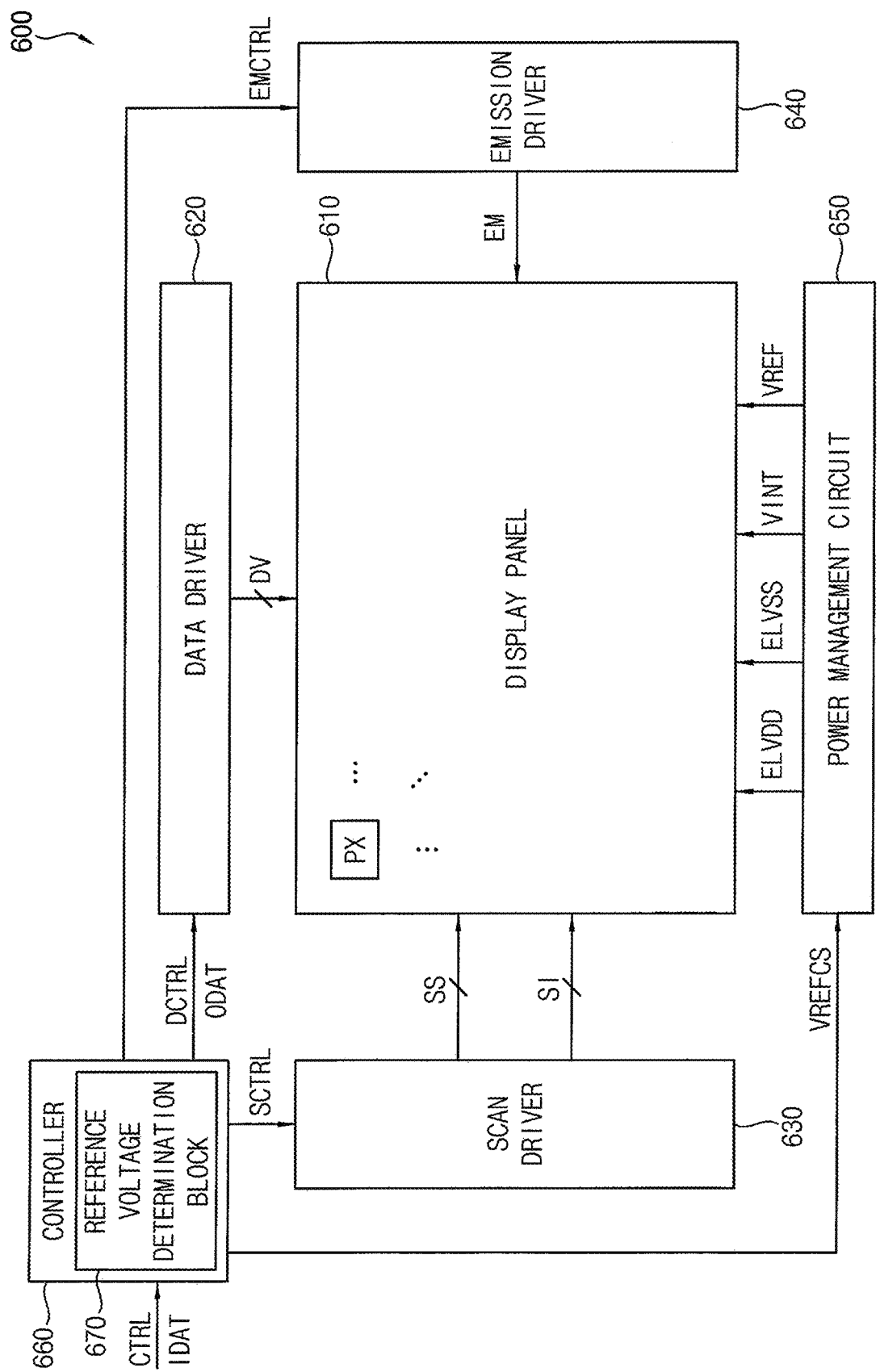
FIG. 11 is a block diagram illustrating an OLED display device according to an embodiment.
Figure 12:
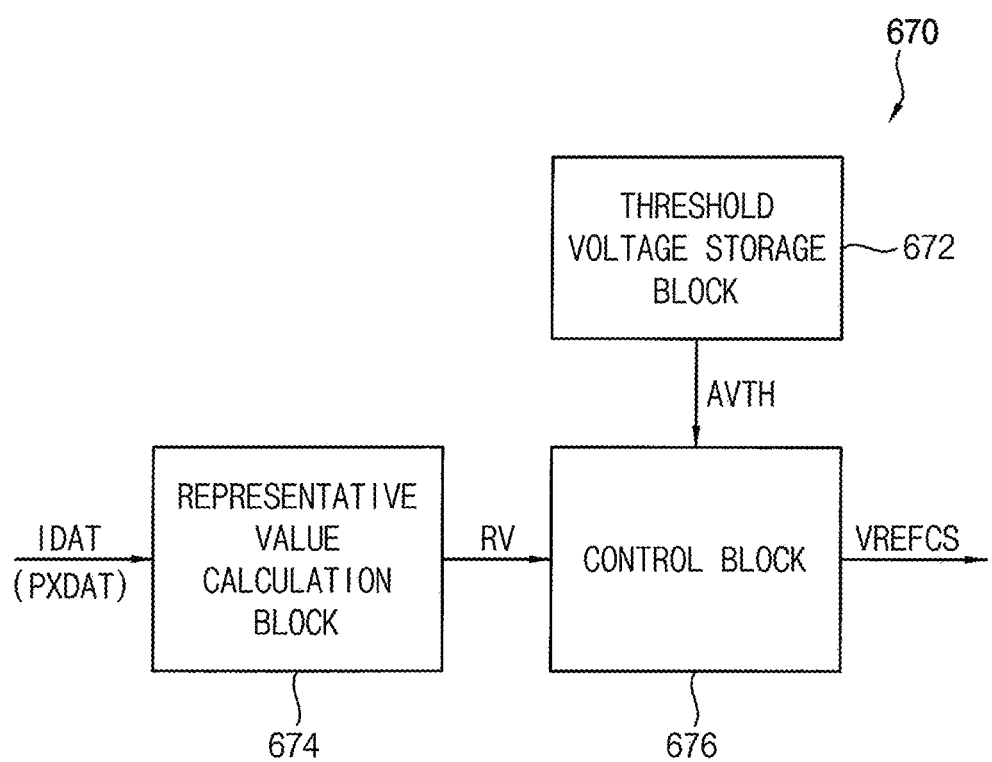
FIG. 12 is a block diagram illustrating an embodiment of a reference voltage determination block included in an OLED display device.

FIG. 11 is a block diagram illustrating an OLED display device according to an embodiment, and FIG. 12 is a block diagram illustrating an embodiment of a reference voltage determination block included in an OLED display device.

Referring to FIG. 11, an embodiment of an OLED display device 600 may include a display panel 610 that includes a plurality of pixels PX, a data driver 620 that provides data voltages DV to the plurality of pixels PX, a scan driver 630 that provides scan signals SS and initialization signals SI to the plurality of pixels PX, an emission driver 640 that provides emission signals EM to the plurality of pixels PX, a power management circuit 650 that provides a first power supply voltage ELVDD, a second power supply voltage ELVSS, an initialization voltage VINT and a reference voltage VREF to the display panel 610, and a controller 660 that controls the data driver 620, the scan driver 630, the emission driver 640 and the power management circuit 650.

The display panel 610 may include the plurality of pixels PX. According to an embodiment, each pixel PX may be a pixel 100 of FIG. 1, a pixel 300 of FIG. 7, a pixel 400 of FIG. 9, a pixel 500 of FIG. 10, or the like. In each pixel PX, a third transistor may include first and second sub-transistors that are coupled to each other in series between a drain of a first transistor and a gate node, a fourth transistor may include third and fourth sub-transistors that are coupled to each other in series between a line of the initialization voltage VINT and the gate node, an eighth transistor may apply the reference voltage VREF to a first node between the first and second sub-transistors in response to the emission signal EM, and a ninth transistor may apply the reference voltage VREF to a second node between the third and fourth sub-transistors in response to the emission signal EM. Accordingly, a leakage current between the gate node and the first node and a leakage current between the gate node and the second node in an emission period may be substantially reduced, and an image quality of the OLED display device 600 may be improved.

The data driver 620 may generate the data voltages DV based on a data control signal DCTRL and output image data ODAT received from the controller 660, and may provide the data voltages DV to the plurality of pixels PX. In an embodiment, the data control signal DCTRL may include, but not limited to, an output data enable signal, a horizontal start signal and a load signal. In an embodiment, the data driver 620 and the controller 660 may be implemented with a signal integrated circuit, and the signal integrated circuit may be referred to as a timing controller embedded data driver ("TED"). In an alternative embodiment, the data driver 620 and the controller 660 may be implemented with separate integrated circuits, respectively.

The scan driver 630 may generate the scan signals SS and the initialization signals SI based on a scan control signal SCTRL received from the controller 660, and may sequentially provide the scan signals SS and the initialization signals SI to the plurality of pixels PX on a row-by-row basis. In an embodiment, the scan control signal SCTRL may include, but not limited to, an initialization start signal, an initialization clock signal, a scan start signal and a scan clock signal. In an embodiment, the scan driver 630 may be integrated or formed in a peripheral portion of the display panel 610. In an alternative embodiment, the scan driver 630 may be implemented with one or more integrated circuits.

The emission driver 640 may generate the emission signals EM based on an emission control signal EMCTRL received from the controller 660, and may provide the emission signals EM to the plurality of pixels PX. In an embodiment, the emission signals EM may be a global signal that is substantially simultaneously provided to the plurality of pixels PX. In an alternative embodiment, the emission signals EM may be sequentially provided to the plurality of pixels PX on a row-by-row basis. In an embodiment, the emission driver 640 may be integrated or formed in the peripheral portion of the display panel 610. In an alternative embodiment, the emission driver 640 may be implemented with one or more integrated circuits.

The power management circuit 650 may generate the first power supply voltage ELVDD, the second power supply voltage ELVSS, the initialization voltage VINT and the reference voltage VREF provided to the display panel 610. In an embodiment, the power management circuit 650 may receive a reference voltage control signal VREFCS representing a voltage level of the reference voltage VREF from the controller 660, and may generate the reference voltage VREF having the voltage level represented by the reference voltage control signal VREFCS. In an embodiment, the power management circuit 650 may be implemented with an integrated circuit, for example a power management integrated circuit ("PMIC"). In an alternative embodiment, the power management circuit 650 may be included in the data driver 620 or the controller 660.

The controller 660 (e.g., a timing controller) may receive input image data IDAT and a control signal CTRL from an external host (e.g., an application processor ("AP"), a graphic processing unit ("GPU") or a graphic card). In an embodiment, the control signal CTRL may include, but not limited to, a vertical synchronization signal, a horizontal synchronization signal, an input data enable signal, a master clock signal, etc. The controller 660 may generate the output image data ODAT, the data control signal DCTRL, the scan control signal SCTRL, the emission control signal EMCTRL and the reference voltage control signal VREFCS based on the input image data IDAT and the control signal CTRL. The controller 660 may control an operation of the data driver 620 by providing the output image data ODAT and the data control signal DCTRL to the data driver 620, may control an operation of the scan driver 630 by providing the scan control signal SCTRL to the scan driver 630, may control an operation of the emission driver 640 by providing the emission control signal EMCTRL to the emission driver 640, and may control an operation of the power management circuit 650 by providing the reference voltage control signal VREFCS to the power management circuit 650.

In an embodiment, as illustrated in FIG. 11, the controller 660 may include a reference voltage determination block 670 for controlling the reference voltage VREF. The reference voltage determination block 670 may determine a voltage level of the reference voltage VREF based on the input image data IDAT, or pixel image data for the plurality of pixels PX and threshold voltages of the first transistors (or driving transistors) of the plurality of pixels PX. In an embodiment, as illustrated in FIG. 12, the reference voltage determination block 670 may include a threshold voltage storage block 672, a representative value calculation block 674 and a control block 676.

The threshold voltage storage block 672 may store a representative threshold voltage AVTH of the first transistors (or the driving transistors) of the plurality of pixels PX of the display panel 610. In an embodiment, the representative threshold voltage AVTH may be an average of the threshold voltages of the driving transistors of the plurality of pixels PX. In an alternative embodiment, the representative threshold voltage AVTH may be a median of the threshold voltages of the driving transistors of the plurality of pixels PX. In an embodiment, when the OLED display device 600 is manufactured, the representative threshold voltage AVTH may be determined, and may be stored in the threshold voltage storage block 672. Different representative threshold voltages AVTH may be used in different OLED display devices 600, and thus the reference voltage VREF suitable for each of the different OLED display devices 600 may be determined independently of each other.

The representative value calculation block 674 may receive the input image data IDAT, or a plurality of pixel image data PXDAT for the plurality of pixels PX of the display panel 610, and may calculate a representative value RV of the plurality of pixel image data PXDAT. In an embodiment, the representative value calculation block 674 may calculate, as the representative value RV, an average of the plurality of pixel image data PXDAT. In an alternative embodiment, the representative value calculation block 674 may calculate, as the representative value RV, a median of the plurality of pixel image data PXDAT. In another alternative embodiment, the representative value calculation block 674 may calculate, as the representative value RV, any value of the plurality of pixel image data PXDAT other than the average and the median.

The control block 676 may determine a representative data voltage corresponding to the representative value RV received from the representative value calculation block 674. In one embodiment, for example, the control block 676 may determine, as the representative data voltage, the data voltage DV corresponding to a gray level represented by the representative value RV by using a lookup table. In an embodiment, the control block 676 may determine the voltage level of the reference voltage VREF by subtracting the representative threshold voltage AVTH from the representative data voltage. The control block 676 may provide the reference voltage control signal VREFCS representing the determined voltage level of the reference voltage VREF to the power management circuit 650, and the power management circuit 650 may generate the reference voltage VREF having the voltage level represented by the reference voltage control signal VREFCS. Thus, in each pixel PX, the reference voltage VREF obtained by subtracting the representative threshold voltage AVTH from the representative data voltage may be applied to the first node between the first and second sub-transistors and the second node between the third and fourth sub-transistors. Accordingly, the leakage current between the gate node and the first node and the leakage current between the gate node and the second node may be substantially reduced, and the image quality of the OLED display device 600 may be improved.

Figure 13:
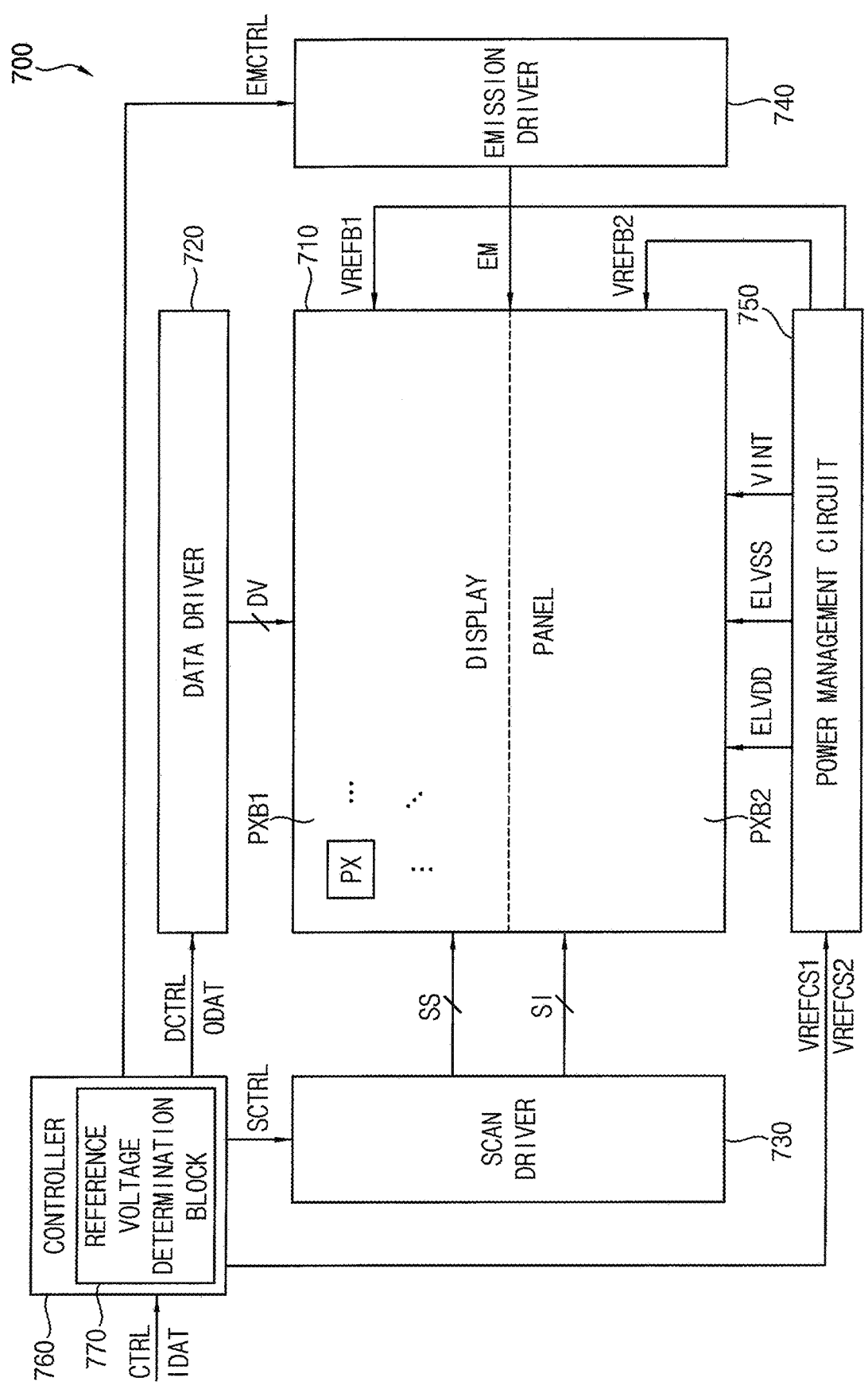
FIG. 13 is a block diagram illustrating an OLED display device according to an alternative embodiment.

FIG. 13 is a block diagram illustrating an OLED display device according to an alternative embodiment.

Referring to FIG. 13, an embodiment of an OLED display device 700 may include a display panel 710, a data driver 720, a scan driver 730, an emission driver 740, a power management circuit 750 and a controller 760. The OLED display device 700 of FIG. 13 may have substantially the same configuration and substantially the same operation as an OLED display device 600 of FIG. 11, except that the display panel 710 may be divided into a plurality of blocks PXB1 and PXB2, and the power management circuit 750 may provide, as a reference voltage VREF, a plurality of block reference voltages VREFB1 and VREFB2 to the plurality of blocks PXB1 and PXB2, respectively.

In such an embodiment of the OLED display device 700, a reference voltage determination block 770 of the controller 760 may determine the plurality of block reference voltages VREFB1 and VREFB2 respectively for the plurality of blocks PXB1 and PXB2. The reference voltage determination block 770 may determine a voltage level of each of the plurality of block reference voltages VREFB1 and VREFB2 based on input image data IDAT for a plurality of pixels PX in each of the plurality of blocks PXB1 and PXB2 and threshold voltages of first transistors (or driving transistors) of the plurality of pixels PX in each of the plurality of blocks PXB1 and PXB2. In one embodiment, for example, as illustrated in FIG. 13, the display panel 710 may be divided into a first block PXB1 (or a upper block) and a second block PXB2 (or a lower block). The reference voltage determination block 770 may determine a voltage level of a first block reference voltage VREFB1 provided to the first block PXB1 based on a representative value of the input image data IDAT for the plurality of pixels PX in the first block PXB1 and a representative threshold voltage of the driving transistors of the plurality of pixels PX in the first block PXB1, and may determine a voltage level of a second block reference voltage VREFB2 provided to the second block PXB2 based on a representative value of the input image data IDAT for the plurality of pixels PX in the second block PXB2 and a representative threshold voltage of the driving transistors of the plurality of pixels PX in the second block PXB2. In an embodiment, the reference voltage determination block 770 may provide a first reference voltage control signal VREFCS1 representing the determined voltage level of the first block reference voltage VREFB1 and a second reference voltage control signal VREFCS2 representing the determined voltage level of the second block reference voltage VREFB2 to the power management circuit 750. The power management circuit 750 may provide the first block reference voltage VREFB1 having the voltage level represented by the first reference voltage control signal VREFCS1 to the first block PXB1, and may provide the second block reference voltage VREFB2 having the voltage level represented by the second reference voltage control signal VREFCS2 to the second block PXB2.

FIG. 13 illustrates an embodiment where the display panel 710 is divided into two blocks PXB1 and PXB2, but not being limited thereto. Alternatively, the display panel 710 may be divided into any number of blocks PXB1 and PXB2, and different block reference voltages VREFB1 and VREFB2 may be provided to the blocks PXB1 and PXB2. FIG. 13 illustrates an embodiment where different (block) reference voltages VREFB1 and VREFB2 are applied to the plurality of blocks PXB1 and PXB2, each including two or more pixels PX, but not being limited thereto. Alternatively, different reference voltages VREF may be applied to the respective pixels PX.

Figure 14:
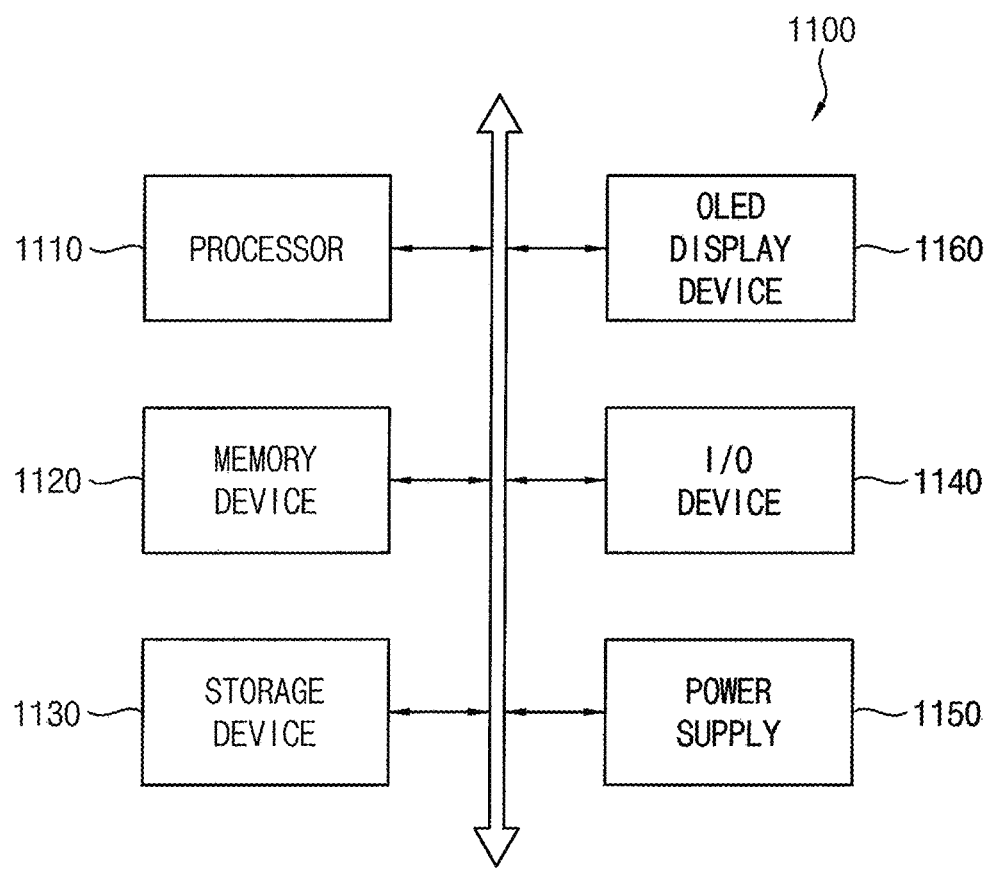
FIG. 14 is an electronic device including an OLED display device according to an embodiment.

FIG. 14 is an electronic device including an OLED display device according to an embodiment.

Referring to FIG. 14, an embodiment of an electronic device 1100 may include a processor 1110, a memory device 1120, a storage device 1130, an input/output (I/O) device 1140, a power supply 1150 and an OLED display device 1160. The electronic device 1100 may further include a plurality of ports for communicating a video card, a sound card, a memory card, a universal serial bus ("USB") device, other electric devices, etc.

The processor 1110 may perform various computing functions or tasks. The processor 1110 may be an AP, a microprocessor, a central processing unit ("CPU"), etc. The processor 1110 may be coupled to other components via an address bus, a control bus, a data bus, etc. In an embodiment, the processor 1110 may be further coupled to an extended bus such as a peripheral component interconnection ("PCI") bus.

The memory device 1120 may store data for operations of the electronic device 1100. In one embodiment, for example, the memory device 1120 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc.

The storage device 1130 may be a solid state drive ("SSD") device, a hard disk drive ("HDD") device, a CD-ROM device, etc. The I/O device 1140 may be an input device such as a keyboard, a keypad, a mouse, a touch screen, etc., and an output device such as a printer, a speaker, etc. The power supply 1150 may supply power for operations of the electronic device 1100. The OLED display device 1160 may be coupled to other components through the buses or other communication links.

In each pixel of such an embodiment of the OLED display device 1160, a third transistor may include first and second sub-transistors that are coupled to each other in series between a drain of a first transistor and a gate node, a fourth transistor may include third and fourth sub-transistors that are coupled to each other in series between a line of an initialization voltage and the gate node, an eighth transistor may apply a reference voltage to a first node between the first and second sub-transistors in response to an emission signal, and a ninth transistor may apply the reference voltage to a second node between the third and fourth sub-transistors in response to the emission signal. Accordingly, a leakage current between the gate node and the first node and a leakage current between the gate node and the second node in an emission period may be substantially reduced, and an image quality of the OLED display device 1160 may be improved.

Embodiments of the invention may be applied to any OLED display device 1160, and any electronic device 1100 including the OLED display device 1160. In one embodiment, for example, embodiments of the invention may be applied to a mobile phone, a smart phone, a wearable electronic device, a tablet computer, a television ("TV"), a digital TV, a three-dimensional ("3D") TV, a personal computer ("PC"), a home appliance, a laptop computer, a personal digital assistant ("PDA"), a portable multimedia player ("PMP"), a digital camera, a music player, a portable game console, a navigation device, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A pixel of an organic light emitting diode display device, the pixel comprising:
   a capacitor including a first electrode coupled to a line of a first power supply voltage, and a second electrode coupled to a gate node;
   a first transistor including a gate coupled to the gate node;
   a second transistor which transfers a data voltage to a source of the first transistor in response to a scan signal;
   a third transistor which diode-connects the first transistor in response to the scan signal, wherein the third transistor includes first and second sub-transistors which are coupled to each other in series between a drain of the first transistor and the gate node;
   a fourth transistor which applies an initialization voltage to the gate node in response to an initialization signal, wherein the fourth transistor includes third and fourth sub-transistors which are coupled to each other in series between a line of the initialization voltage and the gate node;
   a fifth transistor which couples the line of the first power supply voltage and the source of the first transistor in response to an emission signal;
   a sixth transistor which couples the drain of the first transistor and an anode of an organic light emitting diode in response to the emission signal;
   a seventh transistor which applies the initialization voltage to the anode of the organic light emitting diode in response to the initialization signal;
   an eighth transistor which applies a first reference voltage to a first node between the first and second sub-transistors in response to the emission signal;
   a ninth transistor which applies a second reference voltage different from the first reference voltage to a second node between the third and fourth sub-transistors in response to the emission signal; and
   the organic light emitting diode including the anode, and a cathode coupled to a line of a second power supply voltage.

2. The pixel of claim 1, wherein
   the eighth transistor applies the first reference voltage to the first node in an emission period such that a leakage current between the gate node and the first node in the emission period is reduced, and
   wherein the ninth transistor applies the second reference voltage to the second node in the emission period such that a leakage current between the gate node and the second node in the emission period is reduced.

3. The pixel of claim 1, wherein voltage levels of the first and second reference voltages are determined based on the data voltage and a threshold voltage of the first transistor.

4. The pixel of claim 1, wherein the first sub-transistor includes a gate which receives the scan signal, a first terminal coupled to the drain of the first transistor, and a second terminal coupled to the first node,
   wherein the second sub-transistor includes a gate which receives the scan signal, a first terminal coupled to the first node, and a second terminal coupled to the gate node,
   wherein the third sub-transistor includes a gate which receives the initialization signal, a first terminal coupled to the line of the initialization voltage, and a second terminal coupled to the second node, and
   wherein the fourth sub-transistor includes a gate which receives the initialization signal, a first terminal coupled to the second node, and a second terminal coupled to the gate node.

5. The pixel of claim 1, wherein the second transistor includes a gate which receives the scan signal, a first terminal coupled to a data line, and a second terminal coupled to the source of the first transistor,
   wherein the fifth transistor includes a gate which receives the emission signal, a first terminal coupled to the line of the first power supply voltage, and a second terminal coupled to the source of the first transistor,
   wherein the sixth transistor includes a gate which receives the emission signal, a first terminal coupled to the drain of the first transistor, and a second terminal coupled to the anode of the organic light emitting diode, and
   wherein the seventh transistor includes a gate which receives the initialization signal, a first terminal coupled to the line of the initialization voltage, and a second terminal coupled to the anode of the organic light emitting diode.

6. The pixel of claim 1, wherein the eighth transistor includes a gate which receives the emission signal, a first terminal coupled to a line of the first reference voltage, and a second terminal coupled to the first node, and
   wherein the ninth transistor includes a gate which receives the emission signal, a first terminal coupled a line of the second reference voltage, and a second terminal coupled to the second node.

7. The pixel of claim 1, wherein a frame period for the pixel includes:
   an initialization period in which the gate node and the anode of the organic light emitting diode are initialized;
   a data writing period in which a voltage where a threshold voltage of the first transistor is subtracted from the data voltage is stored at the second electrode of the capacitor; and
   an emission period in which the organic light emitting diode emits light.

8. The pixel of claim 7, wherein, in the initialization period,
the fourth and seventh transistors are turned on,
the fourth transistor applies the initialization voltage to the gate node such that the gate node is initialized, and
the seventh transistor applies the initialization voltage to the anode of the organic light emitting diode such that the anode of the organic light emitting diode is initialized.

9. The pixel of claim 7, wherein, in the data writing period,
the second and third transistors are turned on,
the second transistor transfers the data voltage to the source of the first transistor, and
the third transistor diode-connects the first transistor such that the voltage where the threshold voltage is subtracted from the data voltage is stored at the second electrode of the capacitor.

10. The pixel of claim 7, wherein, in the data writing period,
the fifth, sixth, eighth and ninth transistors are turned on,
the first transistor generates a driving current based on a voltage of the gate node,
the fifth and sixth transistors form a path of the driving current from the line of the first power supply voltage to the line of the second power supply voltage,
the eighth transistor applies the first reference voltage to the first node, and
the ninth transistor applies the second reference voltage to the second node.

11. The pixel of claim 1, wherein the first through ninth transistors are implemented with P-type metal-oxide-semiconductor transistors.

12. The pixel of claim 1, wherein the first, second, and fifth through ninth transistors are implemented with P-type metal-oxide-semiconductor transistors, and
wherein the third and fourth transistors are implemented with N-type metal-oxide-semiconductor transistors.

13. An organic light emitting diode display device comprising:
a display panel including a plurality of pixels;
a data driver which provides a data voltage to each of the plurality of pixels;
a scan driver which provides a scan signal and an initialization signal to each of the plurality of pixels;
an emission driver which provides an emission signal to each of the plurality of pixels;
a power management circuit which provides a first power supply voltage, a second power supply voltage, an initialization voltage and a reference voltage to the display panel; and
a controller which controls the data driver, the scan driver, the emission driver and the power management circuit,
wherein each of the plurality of pixels includes:
a capacitor including a first electrode coupled to a line of the first power supply voltage, and a second electrode coupled to a gate node;
a first transistor including a gate coupled to the gate node;
a second transistor which transfers the data voltage to a source of the first transistor in response to the scan signal;
a third transistor which diode-connects the first transistor in response to the scan signal, wherein the third transistor includes first and second sub-transistors which are coupled to each other in series between a drain of the first transistor and the gate node;
a fourth transistor which applies the initialization voltage to the gate node in response to the initialization signal, wherein the fourth transistor includes third and fourth sub-transistors which are coupled to each other in series between a line of the initialization voltage and the gate node;
a fifth transistor which couples the line of the first power supply voltage and the source of the first transistor in response to the emission signal;
a sixth transistor which couples the drain of the first transistor and an anode of an organic light emitting diode in response to the emission signal;
a seventh transistor which applies the initialization voltage to the anode of the organic light emitting diode in response to the initialization signal;
an eighth transistor which applies the reference voltage to a first node between the first and second sub-transistors in response to the emission signal;
a ninth transistor which applies the reference voltage to a second node between the third and fourth sub-transistors in response to the emission signal; and
the organic light emitting diode including the anode, and a cathode coupled to a line of the second power supply voltage, and
wherein the controller includes:
a reference voltage determination block which determines a voltage level of the reference voltage based on image data for the plurality of pixels and threshold voltages of first transistors of the plurality of pixels.

14. The organic light emitting diode display device of claim 13, wherein the reference voltage determination block includes:
a threshold voltage storage block which stores a representative threshold voltage of the first transistors of the plurality of pixels;
a representative value calculation block which calculates a representative value of the image data for the plurality of pixels; and
a control block which determines a representative data voltage corresponding to the representative value of the image data, and determines the voltage level of the reference voltage by subtracting the representative threshold voltage from the representative data voltage.

15. An organic light emitting diode display device comprising:
a display panel including a plurality of pixels;
a data driver which provides a data voltage to each of the plurality of pixels;
a scan driver which provides a scan signal and an initialization signal to each of the plurality of pixels;
an emission driver which provides an emission signal to each of the plurality of pixels;
a power management circuit which provides a first power supply voltage, a second power supply voltage, an initialization voltage and a reference voltage to the display panel; and
a controller which controls the data driver, the scan driver, the emission driver and the power management circuit,
wherein each of the plurality of pixels includes:
a capacitor including a first electrode coupled to a line of the first power supply voltage, and a second electrode coupled to a gate node;
a first transistor including a gate coupled to the gate node;

a second transistor which transfers the data voltage to a source of the first transistor in response to the scan signal;

a third transistor which diode-connects the first transistor in response to the scan signal, wherein the third transistor includes first and second sub-transistors which are coupled to each other in series between a drain of the first transistor and the gate node;

a fourth transistor which applies the initialization voltage to the gate node in response to the initialization signal, wherein the fourth transistor includes third and fourth sub-transistors which are coupled to each other in series between a line of the initialization voltage and the gate node;

a fifth transistor which couples the line of the first power supply voltage and the source of the first transistor in response to the emission signal;

a sixth transistor which couples the drain of the first transistor and an anode of an organic light emitting diode in response to the emission signal;

a seventh transistor which applies the initialization voltage to the anode of the organic light emitting diode in response to the initialization signal;

an eighth transistor which applies the reference voltage to a first node between the first and second sub-transistors in response to the emission signal;

a ninth transistor which applies the reference voltage to a second node between the third and fourth sub-transistors in response to the emission signal; and the organic light emitting diode including the anode, and a cathode coupled to a line of the second power supply voltage, wherein the display panel is divided into a plurality of blocks, and wherein the reference voltage provided to the display panel includes a plurality of block reference voltages provided to the plurality of blocks, respectively.

16. The organic light emitting diode display device of claim 15, wherein the controller includes:

a reference voltage determination block which determines a voltage level of each of the plurality of block reference voltages based on image data for the plurality of pixels in each of the plurality of blocks and threshold voltages of first transistors of the plurality of pixels in each of the plurality of blocks.

* * * * *